(12) United States Patent
Tanbakuchi

(10) Patent No.: US 7,088,109 B2
(45) Date of Patent: Aug. 8, 2006

(54) METHOD AND APPARATUS FOR MEASURING A DIGITAL DEVICE

(75) Inventor: Hassan Tanbakuchi, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 118 days.

(21) Appl. No.: 10/955,627

(22) Filed: Sep. 30, 2004

(65) Prior Publication Data

US 2006/0066289 A1    Mar. 30, 2006

(51) Int. Cl.
   *G01R 23/20*    (2006.01)
(52) U.S. Cl. ..................................... 324/622
(58) Field of Classification Search .............. 324/604, 324/622, 638, 639
   See application file for complete search history.

(56) References Cited

U.S. PATENT DOCUMENTS 5,059,915 A * 10/1991 Grace et al. ............... 324/650
5,089,782 A * 2/1992 Pike et al. .................. 324/623
5,548,538 A * 8/1996 Grace et al. ................ 702/85
6,163,223 A * 12/2000 Kapetanic et al. ........... 331/2
6,529,844 B1 * 3/2003 Kapetanic et al. ........... 702/85

OTHER PUBLICATIONS

Bogdan Szafraniec, Agilent Technologies EPSG talk, Oct. 16, 2002, "Spectral Phase Measurements", pp. 1-14.

Marc Vanden Bossche, Jan Verspecht, Bob Dildine, "Signal Description for the Large Signal Network Analyzer", 6 pages, May 8, 2002.

"Spectral Phase Measurement Technique by Spinning Phasor Method", Oct. 15, 2002, SpinningPhasor.nb.

* cited by examiner

*Primary Examiner*—Anjan Deb
*Assistant Examiner*—John Teresinski
(74) *Attorney, Agent, or Firm*—June L. Bouscaren

(57) ABSTRACT

A method and apparatus for characterizing a non-linear device stimulates the device with a repetitive digital signal and uses relative phase measurements made with a vector network analyzer to measure the device response to the digital stimulus.

61 Claims, 14 Drawing Sheets

METHOD AND APPARATUS FOR MEASURING A DIGITAL DEVICE

BACKGROUND

Digital signal integrity is of increasing importance as operating frequencies and bandwidth increase for digital devices, systems and networks (herein referred to collectively as "digital systems"). Some digital systems are capable of operating at digital frequencies that have significant spectral content in the microwave frequency range. The microwave frequency content requires greater precision at the design phase to accommodate microwave signal behavior in the digital system. In order to reduce design time and costs, it is advantageous to generate an accurate model of the digital system that can reliably simulate a response to a proposed high-speed digital signal. As one of ordinary skill in the art appreciates, a model generated from low frequency measurement data does not properly simulate high frequency performance of the modeled device.

Currently, digital designers use time domain tools and measurement systems, such as oscilloscopes and bit error rate testers to evaluate, qualify and develop models to simulate operation of digital systems. These traditional test tools provide a measurement that indicates whether a circuit operates properly or not under certain operating conditions, but does not provide information into a potential cause or source of any problem. Additionally, these tools cannot provide enough accurate test information that is useful in developing a model to accurately simulate unmeasured behavior. A bit error rate tester provides functional test information and can provide statistical information to provide an eye diagram and to determine jitter, but does not provide quantitative information for development of a model. A high speed digital scope provides quantitative information such as duty cycle distortion, inter-symbol interference and deterministic jitter, but the equipment is costly at the necessary frequencies, does not always provide sufficient bandwidth and dynamic range for accurate measurements, and does not provide enough information for development of a reliable model.

It is possible to make measurements of digital systems in the frequency domain using a vector network analyzer ("VNA"). Prior art frequency domain measurements make relative magnitude and phase measurements between a stimulus and response signal at microwave frequencies to characterize a device under test (herein "DUT") and develop a high frequency model. The stimulus signal for the VNA measurement is a sine wave swept across a desired frequency range. Advantageously, frequency domain measurement technology provides sufficient bandwidth for accurate high frequency measurements and a calibration process that improves overall measurement quality by correcting for measurement artifacts that are not part of the digital system being measured. Measurements using a VNA are capable of accommodating imperfect signal integrity in the stimulus signal, isolating the response of the digital system to the imperfect stimulus and provide signal separation between incident and reflected signals in order to identify a source of signal degradation. VNA measurement technology also provides high dynamic range. In the case of digital system measurement, however, conventional VNA measurement technology has some limitations.

Digital devices operate in a saturated amplification state and therefore exhibit strong non-linearity. Traditional continuous wave measurements test in a linear region and are therefore useful, but incomplete for purposes of creating a simulation model of a digital system. Digital systems exhibit thermal and electrical memory effects meaning that a digital system response to complex signals is different from the response to the mathematical sum of the responses to individual spectral components when measured with a pure sinusoidal stimulus signal. At high speeds approaching the microwave range, the historical content of a digital signal stimulus can affect a response of the digital system at a single point in time. The presence of a frequency component of the stimulus signal can affect a digital system response for another frequency component present at the same time. In other words, some digital systems affect a response to one spectral frequency component in the presence of another spectral frequency component differently than if the other spectral frequency component were not present. An accurate pure sinusoidal stimulus does not simulate the DUT under operating conditions and, therefore, a measurement that uses just the pure sinusoidal stimulus signal cannot characterize an active digital DUT. Accordingly, it is not possible to accurately and reliably predict a digital system response to a complex signal from a series of measurements of the digital system response to individual sinusoidal signals that make up the complex signal in their linear operating regions. Therefore, the swept sine wave type of measurement that characterizes the prior art VNA measurement process is useful, but insufficient to properly stimulate an important effect of a digital system at microwave frequencies. It is advantageous in development of an accurate model of the digital system, to have data that reflects behavior in the non-linear operating regions and to reflect any memory effects of the digital system. There is a need, therefore, for a method and apparatus of measuring a frequency response of a digital system in the presence of a digital signal.

BRIEF DESCRIPTION OF THE DRAWINGS

An understanding of the present invention can be gained from the following detailed description of the invention, taken in conjunction with the accompanying drawings of which.

DETAILED DESCRIPTION

Figure 1:
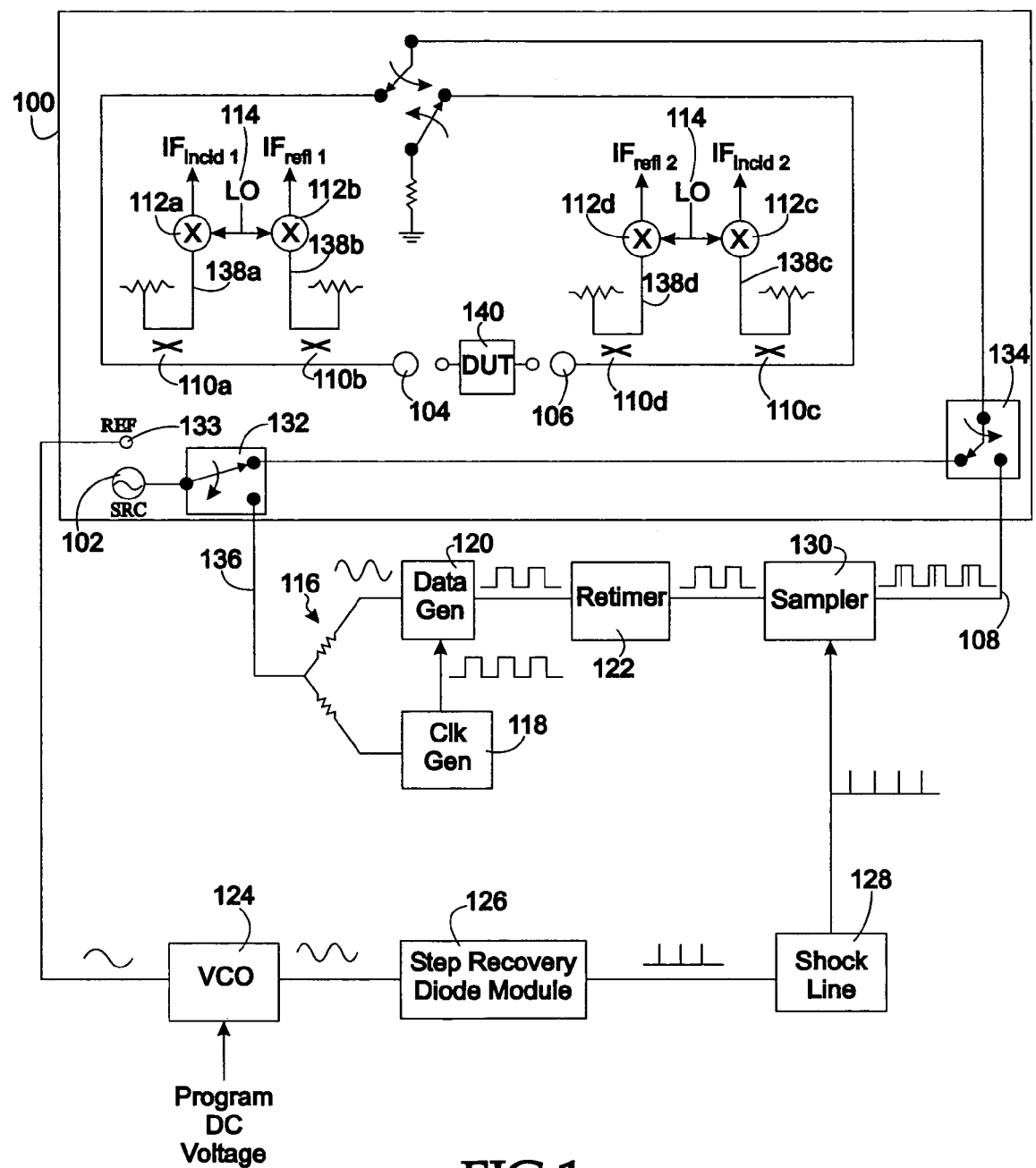
FIG. 1 is a block diagram of an embodiment of an apparatus according to the present teachings.

With specific reference to FIG. 1 of the drawings, there is shown an apparatus according to the present teachings, which includes a known vector network analyzer (herein "VNA") measurement system. The VNA system 100 includes a programmable continuous wave internal signal source 102 for delivering a stimulus signal to port 1 104 or port 2 106 of the VNA 100 through first and second source switches 132, 134 in a VNA calibration position (switch positions as illustrated). Additionally, the VNA source 102 may be optionally decoupled from ports 1 and 2 104, 106 of the VNA and ports 1 and 2 104, 106 may receive a stimulus through an external source input 108 through first and second source switches 132, 134 in a measurement switch position (switch positions opposite to that illustrated in FIG. 1). When the first source switch 132 is in the measurement switch position, the internal signal source 102 is de-coupled internal to the VNA 100 and available at internal source output 136. First and second port one couplers 110a and 110b couple a small portion of an incident and reflected signal, respectively, at port one, for use in an IF measurement system chain 138, 112, 114 while most of the incident and reflected signals appear at the port one 104 of the device under test 140 (herein "the DUT"). First and second port two couplers 110c and 110d similarly couple a small portion of a transmitted and reflected signals respectively at port two while most of the transmitted and reflected signals appear at the port two 106 of the DUT 140. A signal at an output 138a–138d of each coupler 110a–110d is connected to a respective mixer 112a through 112d where it is mixed with a signal from a programmable local oscillator 114 to beat down the coupled signal to a frequency within the available intermediate frequency (herein "IF") bandwidth. The incident and reflected signals from ports one and two 104, 106 of the VNA 100 that fall within the IF bandwidth after passing through the IF chain 110, 138, 112, 114 are digitized and processed using a Fast Fourier Transform (herein "FFT") for measurement of the DUT 140 high frequency response.

It is proposed herein that proper characterization of a digital system includes stimulus of the digital DUT 140 under operating conditions, specifically stimulus with a digital signal and measurement of a relative magnitude and phase between stimulus and response of individual frequencies as well as measurement of relative phase between harmonically related spectral components of the incident digital signal. As one of ordinary skill in the art appreciates, it is not possible to reproduce a digital signal with conventional swept sine s-parameter measurements even if the DUT is stimulated with a digital signal because relative phase information between different spectral components that comprise the digital signal is not recovered in a traditional measurement that measures amplitude and phase of individual spectral components. The present teachings, therefore, propose a solution to measure relative phase of spectral components that comprise the digital signal using swept sine measurements thereby permitting reproduction of a digital response signal using conventional inverse FFT calculations. To that end, an apparatus according to the present teachings decouples the swept sine wave internal signal source 102 from the internal VNA connection to the measurement ports 104, 106 of the VNA 100. The VNA programmable internal signal source 102 is connected to an external power splitter 116 through the internal source output 136. Approximately one half of the stimulus signal is connected to a clock generator 118 that generates a square wave from the sinusoidal stimulus. In a specific embodiment, this is done by operating limiting amplifiers in saturation in response to the stimulus signal. The remaining portion of the signal is connected to a programmable data generator 120 capable of supplying a deterministic and repetitive digital signal from the square wave signal. Any conventional programmable data generator with sufficient bandwidth is suitable for this purpose, such as those used in bit error rate testers or other digital signal generation products. At an output of the data generator 120 is a re-timer 122 that sharpens and removes jitter in the digital signal. In a specific embodiment, the re-timer 122 is an amplifier operating at saturation with a specific frequency transfer function that is tuned to the splitter 116/data generator 120 combination to provide a sharper and improved digital signal. In an alternate embodiment, the re-timer 122 may be adaptive to the splitter 116/data generator 120 combination or the re-timer may not exist in the circuit at all if the data generator can supply a signal with the desired signal characteristics.

An output of the re-timer 122 is connected at an input of through line sampler 130. The output of the sampler is connected to the external source 108 of the VNA 100 for stimulating the DUT 140. In a sampler through or switched "off" position, the sampler 130 appears as a perfect impedance match through line and an output of the sampler 130 is the same as the sharpened digital signal output of the re-timer 122. In a sampler switched "on" position, a voltage controlled oscillator 124 (herein "VCO"), step recovery diode module 126 (herein "SRD") and shock line 128 condition the digital signal input to the sampler 130 as is conventionally known in the art. Specifically, a 10 MHz VNA reference output 133 is connected to the VCO 124 as a frequency reference signal and a frequency output of the VCO 124 is programmed externally as is known in the art. The SRD 126 converts the sine wave output of the VCO 124 to a series of continuous impulses at the VCO output frequency. The shock line 128 further conditions and sharpens the output of the SRD 126. An output of the sampler 130 comprises the deterministic, repetitive digital signal presented at the input of the sampler 130 conditioned with impulses at regular intervals of time. The small impulses in the stimulus signal presented at the output of the sampler 130 provide a synthetic time reference within the stimulus signal to permit measurement by the VNA 100 of relative adjacent phase between harmonically related spectral frequency components.

Figure 2:
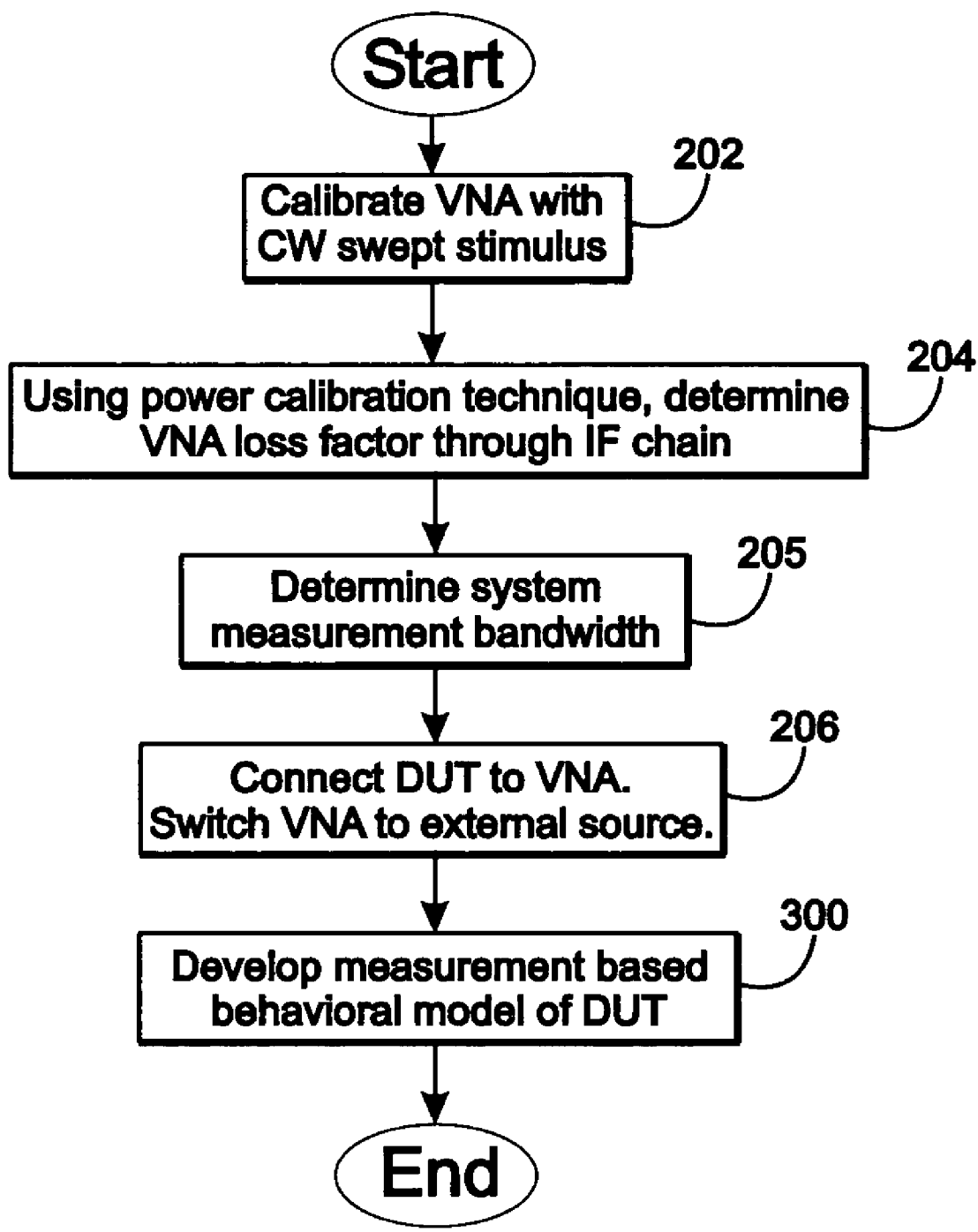
FIG. 2 is a flow chart of a modeling process according to the present teachings.

With specific reference to FIG. 2 of the drawings, there is shown a flow chart of a process according to the present teachings for calibrating, measuring, and developing a measurement based behavioral model of a digital system. The VNA 100 is calibrated 202 using a conventional swept continuous wave calibration using power ratio measurements over the frequency range of interest. A power calibration 204, also conventional, is then performed whereby a swept continuous wave is presented at each VNA port 104, 106 and an absolute power of the incident signal delivered by the internal source 102 is measured by an external power meter (not shown) at each VNA port 104, 106. A measurement of the power presented at an end of the IF chain internal to the VNA 100 is also measured using the internal VNA power meter elements. A ratio of the external measurement made by the external power meters and a reading from the measurement made at the IF with the power meters internal to the VNA 100 provides a measurement loss factor of the IF conversion chain for each measured frequency at each VNA port 104, 106. As is known in the art, loss factors at frequencies not measured may be interpolated. The measurement loss factor calibration results permit accurate absolute power measurements using the VNA 100. Using results of both calibrations, it is then possible to determine absolute power measurements of the incident signal. Because ratios of the reflected incident and reflected transmitted signals are also measured, an absolute power measurement of the reflected incident and reflected transmitted signals may also be determined.

A system bandwidth measurement is then determined 205. For purposes of beginning a process according to the present teachings, a digital clock frequency, $f_{clock}$, is selected. In many cases the clock frequency is the operating clock frequency of the digital DUT and the frequency at which a model of the digital device is to be generated. The system measurement bandwidth of the VNA system 100, 120, 122, 124, 126, 128, and 130 defines a maximum frequency that may be reliably measured using the VNA system. It is determined with measurements made with port one 104 connected directly to port two 106 and, using the external digital data generator 120, stimulating port one 104 with a constant 50% duty cycle square wave at the highest possible stimulus frequency for the given clock frequency. The system measurement bandwidth is establishes as a highest frequency spectral component of the digital signal that is within a predefined amplitude range of the stimulus fundamental frequency where all higher frequency spectral components have a lower amplitude than the predefined range of the stimulus fundamental. As an example, it is suggested that any harmonically related spectral component of the fundamental stimulus frequency where all higher frequency spectral components have measured amplitude that is less than 30 dB down from the fundamental is a maximum frequency the system is able to reliably measure. Care is taken to establish the bandwidth based upon a trend of decreasing amplitude with frequency and to not establish the system measurement bandwidth based upon a local amplitude null.

The DUT is then connected 206 between ports one and two 104, 106 of the VNA 100 with the first and second source switches 132, 134 switched to the external source measurement switch positions. The DUT is stimulated and measured to obtain information to generate a digital simulation model 300.

Figure 3A:
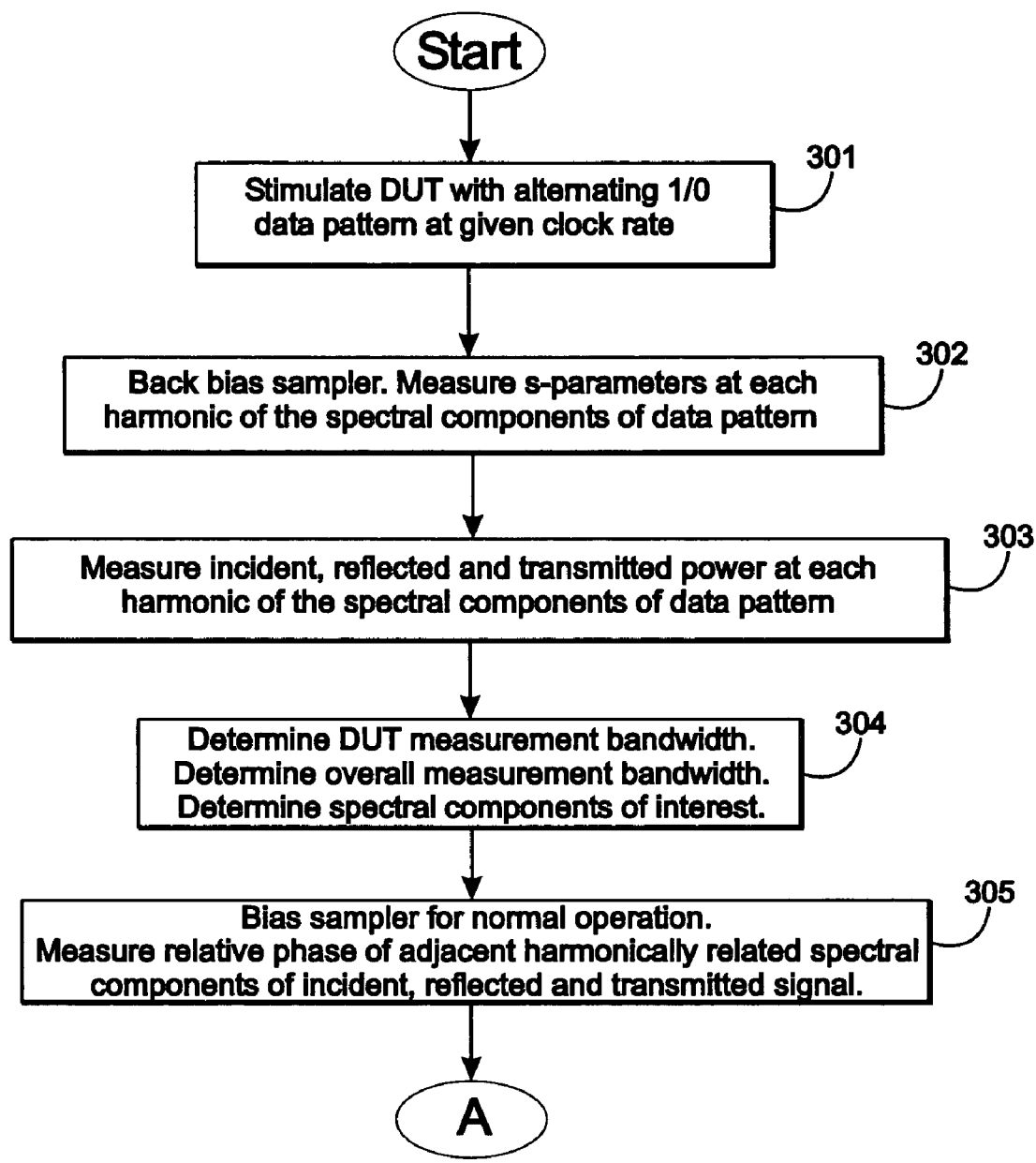
FIGS. 3A, 3B, and 3C are a flow chart of the behavioral based model development step represented in step 300 of FIG. 2.
Figure 3B:
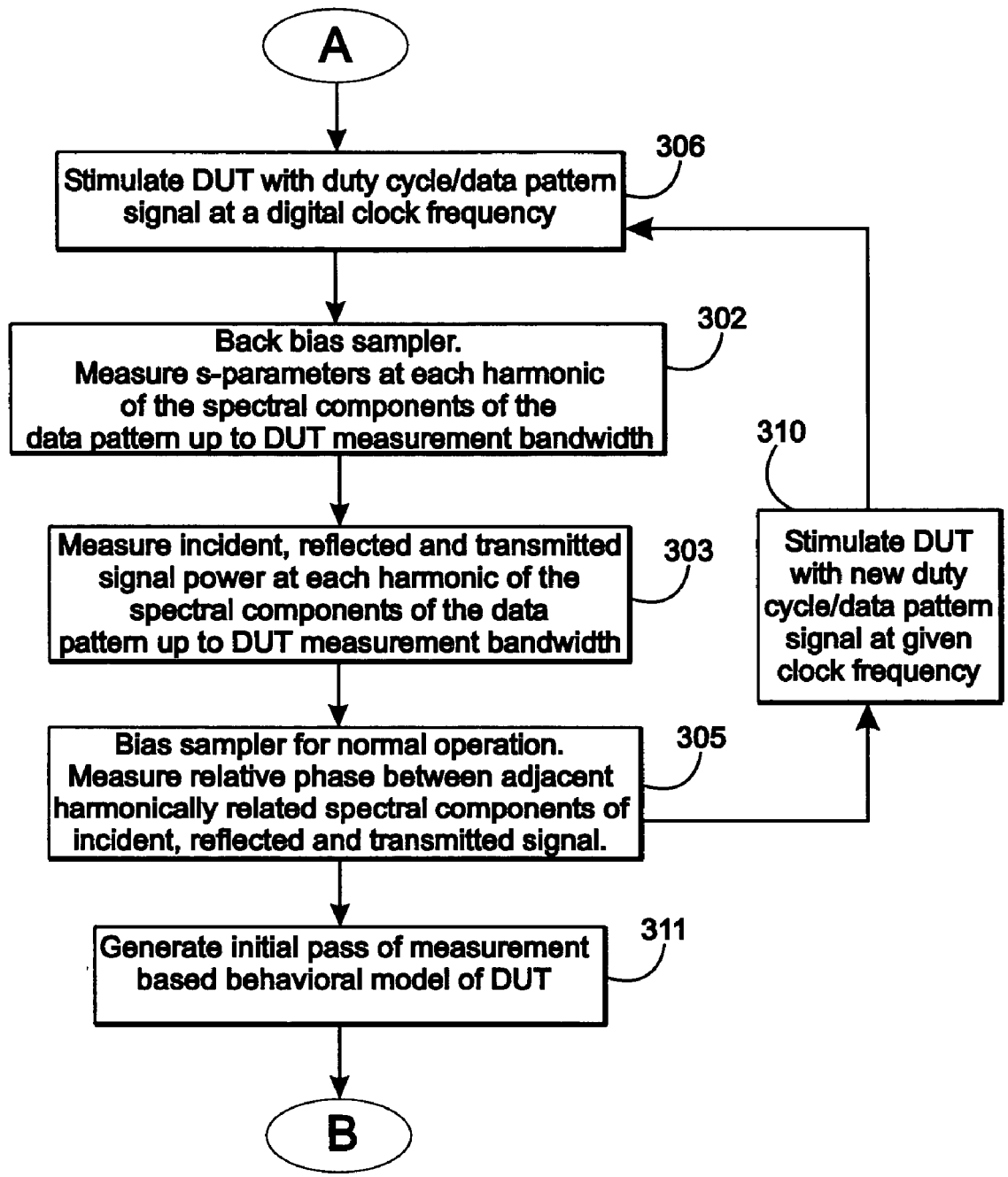
Figure 3C:
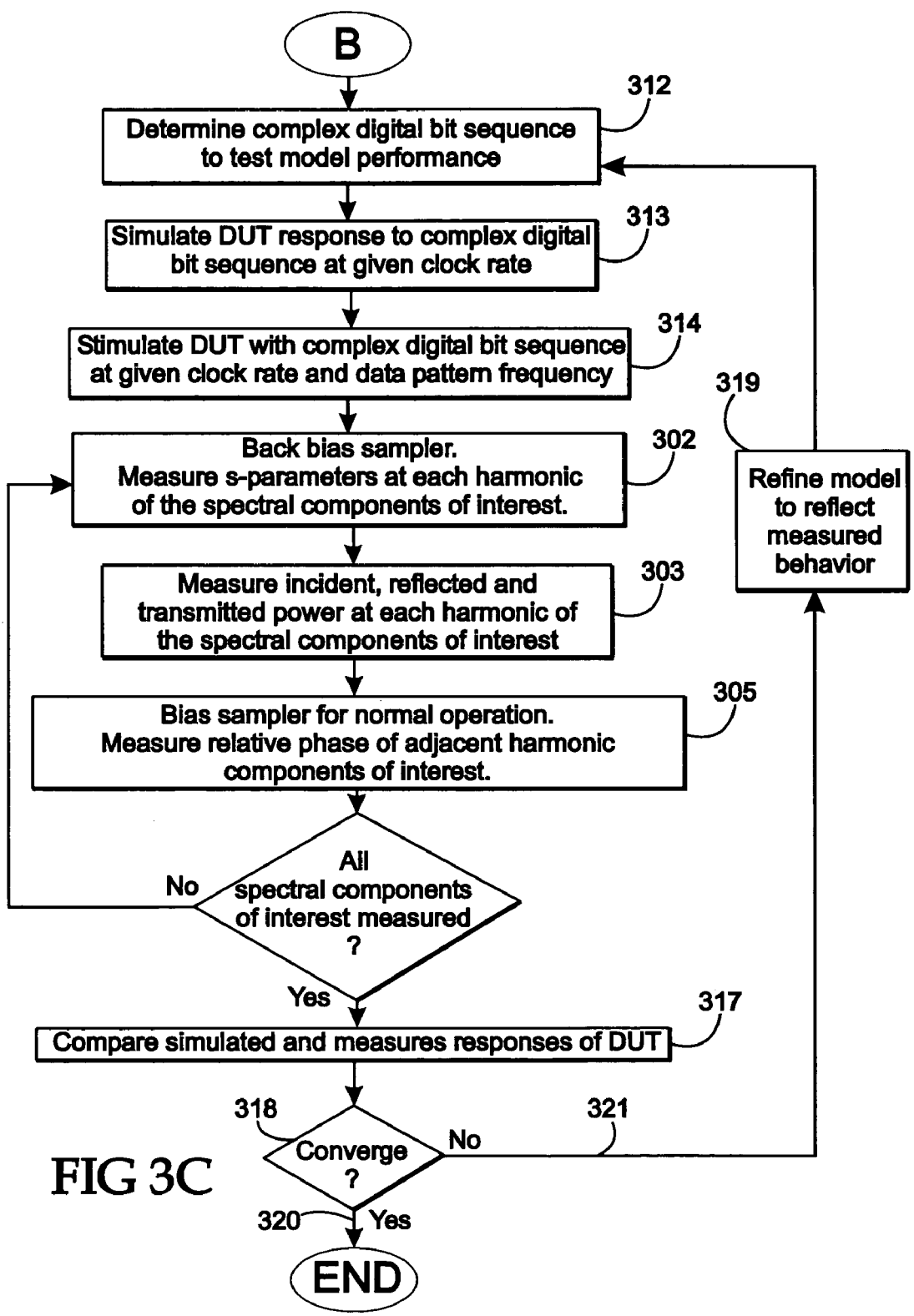

With specific reference, to FIGS. 3A through 3C of the drawings, there is shown a more detailed flow chart of the measurement and modeling steps 300 of a process according to the present teachings. For purposes of the following discussion, it is known that embodiments where calculations and other signal and decision processing are performed external to the VNA 100 are equivalent to embodiments where calculations, decisions and processing is performed internal to the VNA 100 as well as combinations thereof. In a specific embodiment, the DUT 140 is stimulated 301 first with a highest frequency constant 50% duty cycle square wave possible at the clock frequency, $f_{clock}$, which is a frequency of $f_{clock}/2$ using a non-return to zero (herein "NRZ") convention. The constant 50% duty cycle square wave stimulus represents a repetitive digital pattern where the digital value changes at each rising (or falling) transition of the clock to generate a pattern of alternating ones and zeros using the NRZ convention.

In this specific case, therefore, there are two clock cycles for a single cycle of the data. In the general case, there are N clock cycles for each data period if there are N bits per data period. Because data transitions on one clock edge using the NRZ convention, the smallest possible value for N is 2 in order to create a bit sequence with at least one "1" and at least one "0" in the sequence. The general equation for the stimulus signal as a function of the clock, therefore, is represented as:

$$f_{stimulus} = \frac{f_{clock}}{N} \text{ and } T_{stimulus} = NT_{clock} \text{ where interger } N \geq 2 \quad (1)$$

In the specific case of a digital stimulus that transitions with every rising (or falling) edge of the clock, then N=2. Accordingly, the programmable data generator is programmed to deliver a square wave stimulus at half the DUT clock frequency where:

$$f_{stimulus} = \frac{f_{clock}}{2} \text{ and } T_{stimulus} = 2T_{clock} \quad (2)$$

The DUT measurement bandwidth is then determined 304 from measurements made using the 50% duty cycle digital stimulus in much the same way as the system bandwidth is determined. The DUT measurement bandwidth is made with the DUT connected between ports one and two 104, 106 of the VNA 100 and uses a transmission signal at port two 106 upon which to base the determination. The sampler is switched to an "off" position and measurements are made 302, 303 with the highest frequency square wave possible given the clock frequency as the stimulus. Using a NRZ convention, the highest frequency digital signal possible is the constant 50% duty cycle square wave at half the clock frequency. The DUT measurement bandwidth is defined as a highest frequency harmonically related spectral component of the fundamental for the transmission signal that is within the predefined range of the fundamental of the transmission signal where all higher frequency spectral components are less than the predefined range of the transmission signal fundamental. In many cases, the system measurement bandwidth of the VNA system 100 is one or more orders of magnitude greater than the measurement bandwidth of the DUT. If it is, the process of measuring both the DUT measurement bandwidth and the VNA system measurement bandwidth is only as a check to ensure that the VNA system is not limiting the DUT measurement and the DUT measurement bandwidth defines an overall measurement bandwidth. In other cases, however, one or more of the system components are band limited to a frequency that is lower than the DUT measurement bandwidth. Measurements are only reliably taken up to the lowest of the two bandwidth measurements. The overall measurement bandwidth, therefore, is determined 304 based upon the lesser of the DUT measurement and system measurement bandwidths. In some cases, the overall measurement bandwidth determination is dominated by the System measurement bandwidth as a result of an imperfect digital stimulus. In that case, one familiar with the art of non-linear modeling can make a judgment as to additional bandwidth of the DUT that is not readily apparent from the non-ideal stimulus to more closely approximate the DUT measurement bandwidth. The overall measurement bandwidth is represented herein as $BW_{overall}$.

FIGS. 4–7 represent the specific example of a 50% duty cycle square wave stimulus having a frequency of half the frequency of the clock (i.e. N=2). The 50% duty cycle square wave stimulus represents the highest frequency square wave possible for the given clock frequency. Accordingly, it also defines the DUT measurement bandwidth for all lower frequency stimulus signals as well as more complex and lower duty cycle stimulus signals. Also in the present discussion is a description of the more general formulation for more complex stimulus signals where N is greater than 2.

Figure 4:
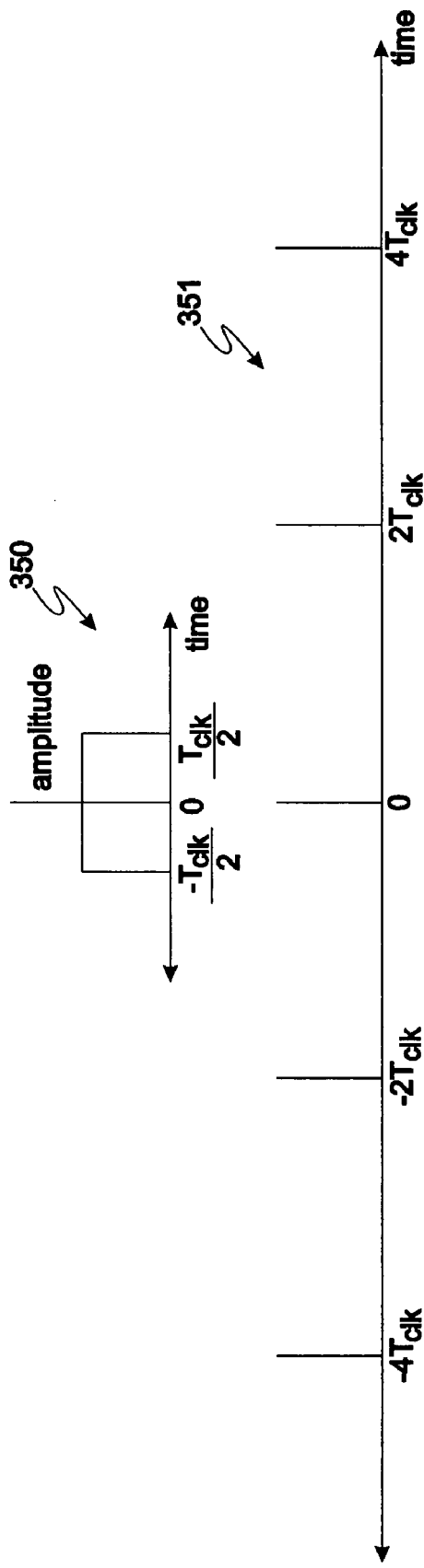
FIG. 4 is a graphical representation in the time domain of functions used to represent a 50% constant duty cycle square wave digital data stimulus.
Figure 5:
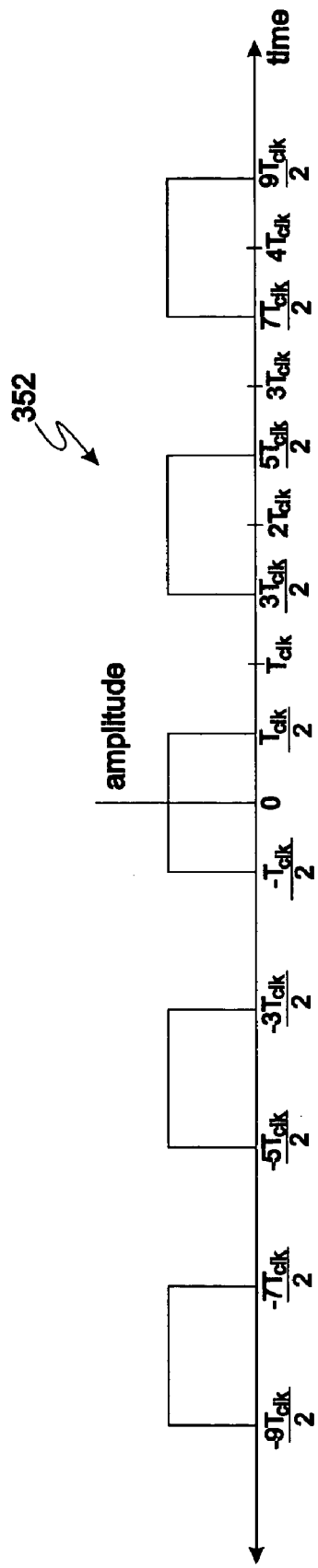
FIG. 5 is a graphical representation in the time domain comprising the convolution of the functions represented in FIG. 4.

With specific reference to FIG. 4 of the drawings, there is shown a graphical representation of a square function 350 in the time domain. A mathematical representation of the same square function 350 is:

$$1 \text{ if } -\frac{T_{clock}}{N} \leq t \leq \frac{T_{clock}}{N} \quad (2)$$
$$0 \text{ if otherwise}$$

Figure 6:
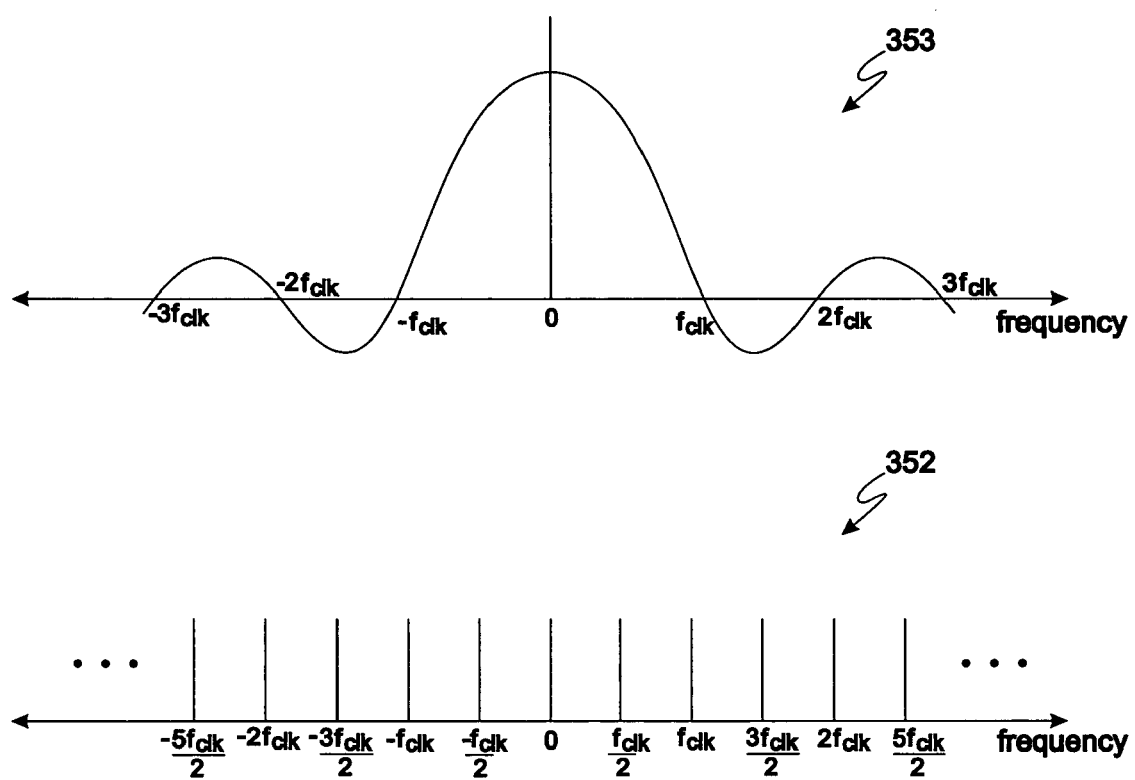
FIG. 6 is a graphical representation in the frequency domain of the time domain functions of FIG. 4.
Figure 7:
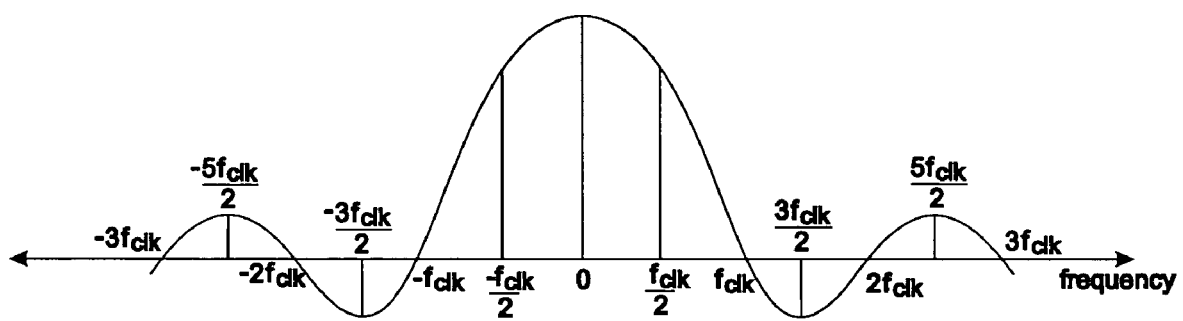
FIG. 7 is a graphical representation in the frequency domain of the multiplication of the functions shown in FIG. 6 and a representation in the frequency domain of the function shown in FIG. 5.

Also in FIG. 4 of the drawings, there is shown a comb function 351 in the time domain with impulses at $2T_{clock}$, $-2T_{Clock}$, and integer multiples thereof. The comb function represents those moments in the time domain when the center of the digital data represents a "1". With specific reference to FIG. 5 of the drawings, there is shown the result 352 of a mathematical convolution of the square function with the comb function in the time domain shown in FIG. 4. As illustrated, the result 352 of the time domain convolution is a constant 50% duty cycle square wave having a period of $T_{stimulus}$ or $2T_{clock}$ in the specific example. With specific reference to FIG. 6 of the drawings, there is shown a frequency domain representation 353 of the time domain square function 350. Also shown in FIG. 6 is a frequency domain representation 354 of the time domain comb function 351. As one of ordinary skill in the art appreciates, convolution in the time domain is equivalent to multiplication in the frequency domain. Accordingly, and with specific reference to FIG. 7 of the drawings, there is shown a frequency domain representation of the multiplication of the frequency domain graphs of FIG. 6. The constant 50% duty cycle square wave shown in the time domain of FIG. 5, therefore, has a frequency domain representation shown in FIG. 7. As illustrated mathematically, because the 50% duty cycle square wave is a repetitive signal, it comprises multiple stationary and harmonically related known spectral components in the frequency domain. It is possible, therefore, to calculate the harmonically related spectral components of interest. For purposes of the present teachings, the harmonically related spectral components of interest are those spectral components of the digital stimulus signal that are within a overall measurement bandwidth. The overall measurement bandwidth is defined by a highest frequency harmonic of the clock frequency having amplitude that is within 30–50 dB of the largest amplitude spectral component being measured as determined from the highest frequency 50% constant duty cycle square wave at a given clock frequency. It is believed that this provides sufficient accuracy to develop a model of the device for most practical purposes. In the specific example of the 50% duty cycle square wave at half of the clock frequency, the largest amplitude component of the digital data signal is the fundamental having a frequency of half of the clock frequency. The fundamental, therefore, is a first spectral component of interest, $f_{meas\_1}$, and is the stimulus fundamental frequency, $f_{stim\_fund}$. A factor, K, is defined as part of a relationship between the clock frequency and the overall bandwidth of the DUT and system measurement:

$$Kf_{clock} = BW_{overall} \quad (3)$$

Because the overall measurement bandwidth of the DUT does not change for a given clock frequency regardless of the frequency of the stimulus, K is constant for all measurements using the same clock frequency. In the specific example, the overall measurement bandwidth is calculated or measured to be 10 GHz for a 2 GHz clock. Accordingly, K=5 for all measurements made with the 2 GHz clock. The spectral components of interest are those harmonics of the stimulus fundamental up to and including $NKf_{stim\_fund}$. For the specific example, the second harmonic of a perfect square wave is a local null. If the spectral component is measured as a null, it is of no interest in the measurement because it is not possible to measure relative phase between two spectral components if one of the spectral components does not have sufficient amplitude. As a practical matter, however, the square wave is not perfect and in many cases there is sufficient second harmonic content to make a measurement. The amplitude of the second harmonic, therefore, determines whether or not the second harmonic is a spectral component of interest in the relative phase measurement. In the present example, it is assumed that the second harmonic has sufficient amplitude to be a spectral component of interest and is included in the measurement as $f_{meas\_2}$. The third, fifth, seventh and ninth harmonics of the fundamental are also spectral components of interest. They are represented as $f_{meas\_3}$, $f_{meas\_5}$, $f_{meas\_7}$, and $f_{meas\_9}$. The fourth, sixth, and eighth harmonics may also be local nulls, but for the present discussion, they are treated the same as the second harmonic and are represented as $f_{meas\_4}$, $f_{meas\_6}$, $f_{meas\_8}$, and $f_{meas\_10}$. For the present illustration, the spectral components of interest are those harmonically related spectral components that are measured to have amplitude within 30–50 dB of the fundamental. It is defined as such because it is believed that all harmonics having an amplitude within 30–50 dB of the amplitude of the fundamental are adequate to measure for purposes of reproducing the time domain signal of which the harmonics are the constituent spectral components. In some applications of the present teachings, it may be desired to measure all spectral components within 50 dB of the fundamental to achieve a more accurate model. It is to be understood that as measurement dynamic range decreases and as digital frequencies increase, it may be further be desirable to measure harmonically related spectral components that are less than 30 dB or greater than 50 dB down from the fundamental depending upon the capability of the measurement technology. Accordingly, 30 dB down is used herein for illustrative purposes only and is not meant to limit that which is claimed.

With the sampler 130 in a back-biased or switched "off" state 302, the sampler 130 appears as a perfectly impedance matched zero delay through and conventional S-parameter measurements are made with the VNA 100 at the stimulus fundamental frequency, $f_{stim\_fund}$, and all harmonically related spectral components of the fundamental, $nf_{stim\_fund}$ where n is a series of integers. Additionally, an absolute power of the incident signal at the same fundamental and harmonically related spectral components of the fundamental are measured 303 using the measured IF signal and measurement loss factor determined in step 204. From the measured S-parameters and the measurement loss factor, it is possible to calculate an absolute power of the transmitted, reflected incident and reflected transmitted spectral components for the fundamental and at each harmonically related spectral components of the fundamental. Alternatively, the absolute power of the transmitted, reflected incident, and reflected transmitted signals may be measured 303.

The harmonically related spectral components initially measured for the given digital clock frequency, $f_{clock}$, therefore, are the fundamental stimulus frequency and all spectral components harmonically related to the fundamental stimulus frequency having frequencies lower than the overall measurement bandwidth. In the example of a 2 GHz clock and a 1 GHz square wave stimulus signal (where N=2), the DUT measurement bandwidth is measured to be 10 GHz. Therefore, the spectral components of interest are constituent harmonically related spectral frequencies up to 10 GHz. With reference to equation (3), 2 GHz(K)=10 GHZ and K=5. In the example of a perfect square wave at half the clock frequency, the harmonically related spectral components of interest are 1 GHz, 3 GHz, 5 GHz, 7 GHz, and 9 GHz respectively. For purposes of the present example, however, it is recognized that the stimulus is not a perfect square wave and all harmonically related spectral components between 1 GHz and 10 GHz are of interest even though they may be less than 30 dB down from the fundamental. Accordingly, the harmonically related spectral components of interest in the present example are 1 GHz–10 GHz and all frequencies in the frequency domain at 1 GHz intervals.

The digital signal measurement process continues with the step of forward biasing the sampler to an "on" state permitting conditioning of the digital stimulus signal with the synthetic time domain impulses and measuring relative phase 305 between adjacent ones of the spectral components of interest in the incident and transmitted signals. For example, a relative phase is measured between first and second harmonically related spectral components of interest, $f_{meas\_1}$ and $f_{meas\_2}$. Relative phase is also measured between second and third harmonically related spectral components of interest, $f_{meas\_2}$ and $f_{meas\_3}$, up to relative phase measured between $f_{meas\_NK-1}$ and $f_{meas\_NK}$.

Figure 8:
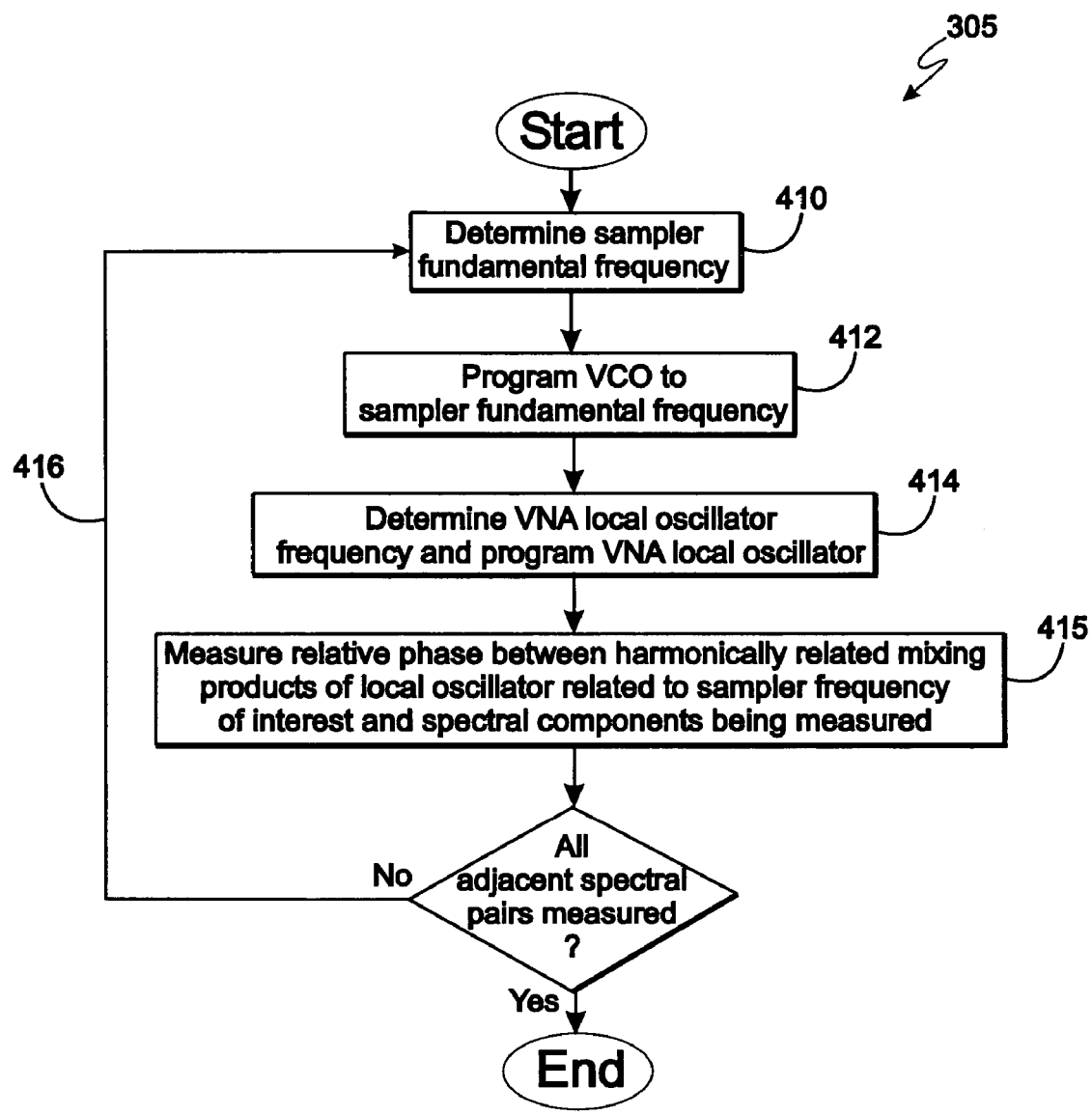
FIG. 8 is a flow chart detailing the steps for making a relative phase measurement according to the present teachings.

With specific reference to FIG. 8 of the drawings, there is shown a more detailed flow chart of the process for measuring relative phase 305 between the harmonically related spectral components of interest, $f_{meas\_1}$ through $f_{meas\_NK}$ that are adjacent in the frequency domain. As one of ordinary skill in the art appreciates, nine relative phase measurements are made for ten spectral components of interest. If adjacent relative phase measurements are made, it is further possible to determine relative phase between non-adjacent spectral components by cumulating the adjacent relative phase measurements. If one of the harmonics is a local null, a relative phase is measured between a harmonic above and a harmonic below the local null.

A measurement of relative phase 305 between harmonically related spectral components comprises first an appropriate selection 410 of a sampler fundamental frequency, $f_{samp\_fund}$. It is desired to have a sampler harmonic frequency half-way between all of the harmonics of the stimulus frequency fundamental for which relative phase is to be measured less a small frequency offset. A minimum sampler frequency, therefore, is a frequency that is approximately halfway between the first and second spectral components of interest less some frequency offset. A sampler fundamental, therefore, must be at least one half of the minimum sampler frequency. A value for the small offset is determined based upon the lowest frequency relative phase measurement. The offset frequency for the lowest frequency spectral pair to be measured is represented as $f_{offset}$. The first spectral component of interest is represented as $f_{clock}/N$, so the minimum sampler frequency is represented as:

$$f_{samp\_min} = \frac{f_{clock}}{2N} - \frac{f_{offset}}{3} \qquad (4)$$

For very high clock frequencies, it is possible that the minimum sampler frequency does not fall within a sampler fundamental frequency range. The minimum sampler frequency must be greater than or equal to the sampler fundamental frequency and still be a harmonic of the sampler fundamental frequency. For purposes of optimal sampler signal to noise ratio, it is further desirable to drive the sampler at the highest frequency that provides sufficient harmonics to make the relative phase measurement between all spectral components of interest. A factor, M, is defined as the smallest integer value to place the $f_{samp\_fund}$ within its available frequency range where:

$$f_{samp\_fund} = \frac{f_{samp\_min}}{M} = \frac{f_{clock}}{2NM} - \frac{f_{offset}}{3M} \qquad (5)$$

In the present example, of a 2 GHz clock and a 1 GHz stimulus signal, N=2 and:

$$f_{samp\_fund} + \frac{f_{samp\_min}}{M} = \frac{2\text{GHz}}{2 \cdot 2M} - \frac{f_{offset}}{3M} = \frac{500\text{MHz}}{M} - \frac{f_{offset}}{3M} \qquad (6)$$

The bandwidth of the sampler drive frequency is 2 MHz to 500 MHz. Because the $f_{offset}$ factor is subtracted in the equation, it is shown that for M=1, the minimum sampler frequency is within the sampler frequency bandwidth. Accordingly, the smallest integer for M that places the sampler fundamental within the sampler bandwidth is 1 and the sampler fundamental frequency is established. As one of ordinary skill appreciates, M=2 also places the sampler fundamental with the fundamental drive frequency range. The sampler fundamental, however, is at a lower frequency, which will work, but is not optimal with respect to sampler signal quality.

The largest frequency offset for purposes of the relative phase measurement is limited by the VNA IF bandwidth. It is further desirable to use as large an offset as possible in order to improve frequency resolution for the lower frequency measurements. Accordingly, it is preferred to select an offset that uses most of the IF bandwidth for the highest frequency measured. The largest frequency offset is used for a relative phase measurement between the highest and next highest harmonic of the stimulus frequency that is within the overall measurement bandwidth. In the present example, the highest frequency harmonically related spectral component of interest is 10 GHz and the next highest is 9 GHz. The IF bandwidth of the VNA 100, is 100 kHz in a specific example and is represented as $BW_{IF}$. K is known and in the present example, K=5. The frequency offset should be smaller than or equal to the VNA IF bandwidth divided by 4K, but as large as possible, so that a smallest offset used in the relative phase measurement is easily resolvable within the IF bandwidth. If the frequency offset is evenly divisible by M and has a harmonic equal to the sampler fundamental, the frequency offset should be adjusted slightly for reasons that will be apparent after a reading of the present teachings.

The maximum sampler frequency, $f_{samp\_max}$, is represented as a function of the highest and next highest spectral frequency of interest, $f_{meas\_NK}$ and $f_{meas\_NK-1}$, respectively, where NK is the highest harmonic of the harmonically related spectral components of interest.

$$f_{samp\_max} = \frac{f_{meas\_NK} + f_{meas\_NK-1}}{2} - \left(\frac{NKf_{offset} + (NK-1)f_{offset}}{3}\right) \quad (6)$$

$$= \left(\frac{NK\frac{f_{clock}}{N} + (NK+1)\frac{f_{clock}}{N}}{2}\right) - \frac{(2NK-1)f_{offset}}{3}$$

$$= \frac{(2NK-1)f_{clock}}{2N} - \frac{(2NK-1)f_{offset}}{3}$$

For the present illustration, therefore:

$$f_{samp\_max} \leq \frac{10\text{GHz} + 9\text{GHz}}{2} - \frac{(2NK-1)}{3}f_{offset} = 9.5\text{GHz} - \frac{19}{3}f_{offset} \quad (8)$$

and $$f_{samp\_min} \leq \frac{1\text{GHz}}{2} - \frac{f_{offset}}{3} = 500\text{MHz} - \frac{f_{offset}}{3} \quad (9)$$

Equation (8) shows a factor for the largest offset used for purposes of the relative phase measurement. It is optimal for the largest offset to be less than the VNA IF bandwidth divided by 4, or:

$$\frac{(2NK-1)}{3}f_{offset} \leq \frac{BW_{IF}}{4} \quad (10)$$

In the specific example, K=5, N=2, and the VNA IF bandwidth is 100 kHz. Accordingly:

$$\frac{(2 \cdot 2 \cdot 5 - 1)}{3}f_{offset} \leq \frac{100\text{kHz}}{4} \quad (11)$$

$$\frac{19}{3}f_{offset} \leq 25\text{kHz}$$

$$\frac{f_{offset}}{3} \leq \frac{25}{19}\text{kHz}$$

For purposes of clarity and ease of calculation, a sampler fundamental frequency offset, $f_{offset}/3$ is set to 1 kHz for the specific example and the sampler fundamental frequency is established as 500 MHz–1 kHz. Sampler frequencies of interest are those sampler harmonics that are used in the relative phase measurement and are represented as:

$$f_{samp\_q-1} = \frac{(2q-1)f_{clock}}{2N} - (2q-1)\frac{f_{offset}}{3} \quad (12)$$

where integer $q = 2$ to $NK$

The system programs 412 the VCO 124 to the established sampler fundamental frequency. The sine wave output of the VCO 124 is converted to impulses that are input to the sampler 130 to condition the stimulus signal. Accordingly, all harmonics of the sampler fundamental are present in the stimulus signal. At this point in the process, the $f_{samp\_fund}$, $f_{offset}$, K and M variables are established values for the already established $f_{clock}$, N, $f_{meas\_1}$ through $f_{meas\_NK}$, and IF bandwidth of the VNA, $BW_{IF}$. If the data pattern has spectral content below 2 MHz, a direct measurement of the spectrum can be obtained using conventional high speed digitizing techniques. The portion of the spectrum below 2 MHz, can be added to measurements made according to the present teachings to complete characterization of the DUT over the full frequency range of interest.

Also for the relative phase measurement, a local oscillator frequency, $f_{lo}$, for the VNA 100 is determined 414 based upon the frequencies of the harmonically related spectral components of interest and the IF bandwidth of the VNA 100. For purposes of illustration, and for clarity, the discussion is continued relative to the example of a 2 GHZ digital signal, and specifically, a 2 GHz non-return to zero digital signal with alternating "1's" and "0's", which is approximated as a 1 GHz square wave having a constant 50% duty cycle. As previously discussed, the fundamental through tenth harmonics are the spectral components of interest, $f_{meas\_1}$ through $f_{meas\_10}$, respectively. In the present example, therefore, there are NK–1 or nine separate relative phase measurements made. A first relative phase measurement is made between a first pair of spectral components. The first spectral pair is the first spectral component of interest, $f_{meas\_1}$, which in the present example is the fundamental stimulus frequency of 1 GHz, and the second spectral component of interest, $f_{meas\_2}$, which is a second harmonic of the stimulus frequency of 2 GHz. A second relative phase measurement is made between a second pair of spectral components, the second spectral component of interest, $f_{meas\_2}$, and the third spectral component of interest, $f_{meas\_3}$, which is a third harmonic stimulus frequency of 3 GHz. A similar measurement is made between all pairs of spectral components that are adjacent in the frequency domain up to the ninth and tenth harmonics of the fundamental stimulus frequency. Measurement is made on the VNA 100 having a 100 kHz IF bandwidth.

Figure 9:
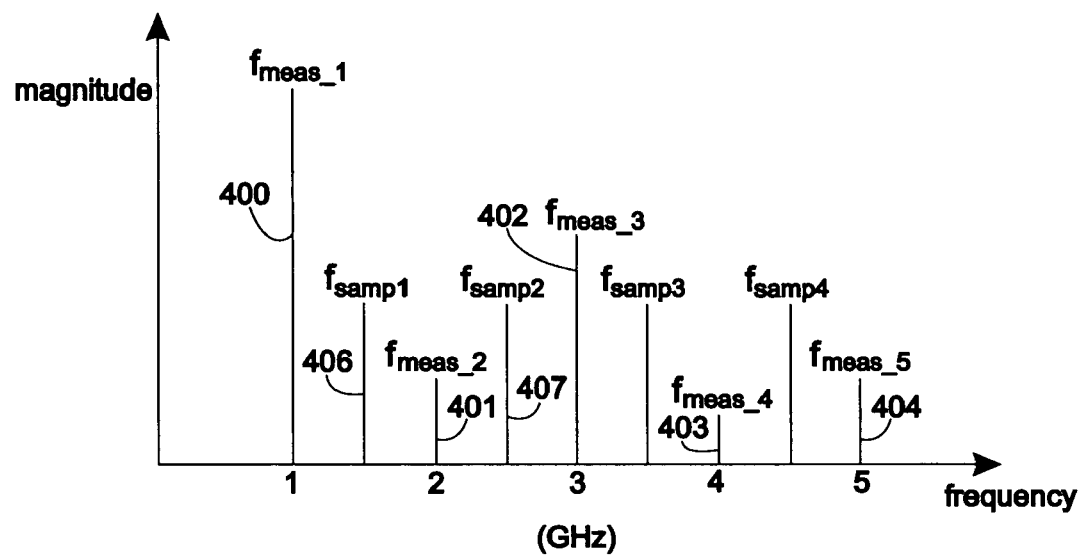
FIG. 9 is a graphical representation showing frequencies of interest in a relative phase measurement of harmonically related adjacent spectral components and of sampler harmonic spectral lines.
Figure 10:
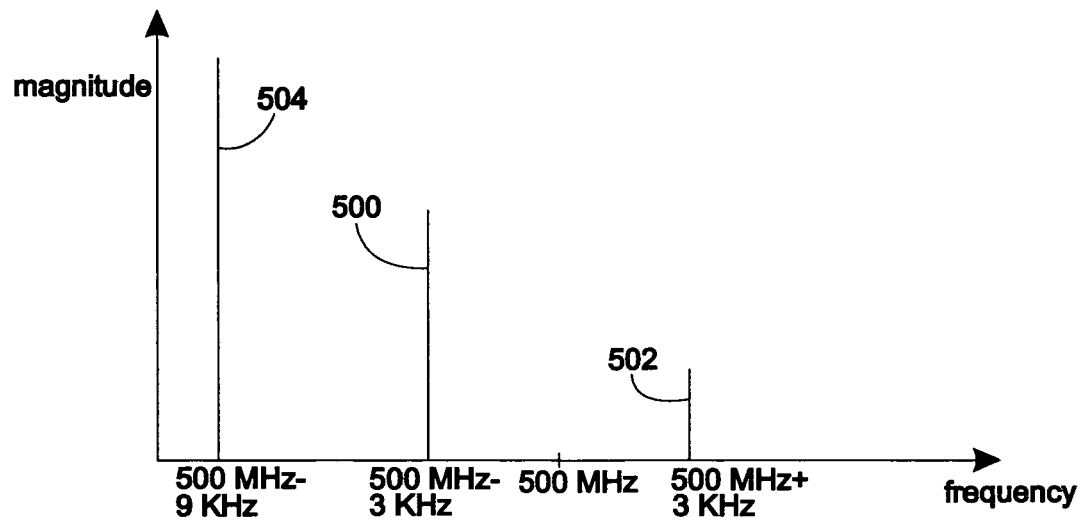
FIG. 10 is a graphical representation in the frequency domain of primary mixing products created in a process according to the present teachings and a VNA local oscillator signal for measurement of relative phase.
Figure 11:
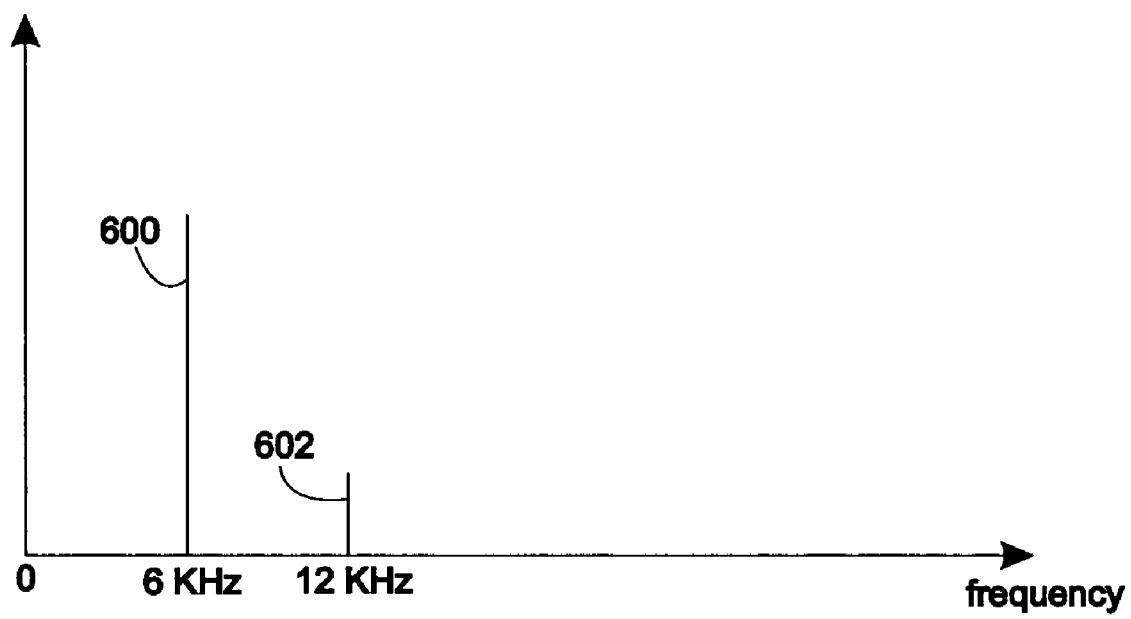
FIG. 11 is a graphical representation in the frequency domain of secondary mixing products in a VNA IF bandwidth for measurement of relative phase.

With specific reference to FIG. 9 of the drawings, there is shown a frequency domain graphical representation of the first through fifth spectral components of interest comprising the fundamental, $f_{meas\_1}$ 400, second harmonic, $f_{meas\_2}$ 401, third harmonic, $f_{meas\_3}$ 402, fourth harmonic, $f_{meas\_4}$ 403, and fifth harmonic, $f_{meas\_5}$ 404 of the 1 GHz square wave stimulus signal. As one of ordinary skill in the art appreciates, the measurement process disclosed may be adapted and extended up to the highest frequency spectral pair according to the parameters of the relative phase measurement process that is presented. For measurement of the relative phase between $f_{meas\_1}$ and $f_{meas\_2}$, the first sampler frequency, $f_{samp\_1}$ 406, is the frequency that is harmonically related to the calculated sampler fundamental frequency disposed in the frequency domain approximately halfway between the two frequencies being measured less the offset. In the current example, the sampler fundamental frequency is 500 MHz–1 kHz. Accordingly, the first sampler frequency of interest 406 is 1.5 Ghz–3 kHz. With specific reference to FIG. 10 of the drawings, the first and second spectral components of interest, $f_{meas\_1}$ 400 and $f_{meas\_2}$ 401 mix with the first sampler frequency $f_{samp1}$ 406 to yield first and second sampler mixing products, 500 and 502. In the example, the first and second sampler mixing products 500, 502 are 500 MHz–3 kHz and 500 MHz+3 kHz, respectively. As one of ordinary skill in the art appreciates, in a practical application, there is more frequency content in the measured frequency range than is shown in FIGS. 9 and 10. Specifically, the output of the sampler 130 has a very rich spectral content. In addition, there are numerous lower amplitude secondary and tertiary mixing products of the sampler frequencies and the spectral components of the stimulus signal. The frequencies represented in FIGS. 9, 10, and 11, however, are only those frequencies used to yield the desired measurement in a process according to the present teachings. Because the mathematical model is known, so are the specific frequencies used to make the desired measurements. It is also known through careful selection of the sampler fundamental frequency, $f_{samp\_fund}$, and the frequency of the VNA local oscillator, $f_{lo}$, based upon the spectral content of the stimulus signal, that the frequencies of interest are representative of the phenomenon to be measured.

For each relative phase measurement, the frequency of the VNA local oscillator 114 for the relative phase measurement is calculated as:

$$f_{lo\_q-1} = \frac{f_{meas\_q} - f_{meas\_q-1}}{2} - 3\frac{(2q-1)}{3}f_{offset} \text{ for } q = 2 \text{ to } NK \quad (13)$$

$$= \frac{f_{meas\_q} - f_{meas\_q-1}}{2} - (2q-1)f_{offset} \text{ for } q = 2 \text{ to } NK$$

As one of ordinary skill in the art appreciates, the frequency difference between all adjacent harmonically related spectral components of interest is typically the same value, although in the case of a local null at one of the spectral components, this is not necessarily true. For that reason, the equation is kept in its general form. For each relative phase measurement, a different harmonic of the sampler fundamental is used and the local oscillator frequency is tuned to a different frequency for each relative phase measurement depending upon the expected mixing products. In the present example, therefore, the local oscillator frequency is tuned to:

$$f_{lo\_q-1} = 500 \text{ MHz} - (2q-1)3 \text{ kHz for } q=2 \text{ to } NK \quad (14)$$

Accordingly, the local oscillator frequency change is defined by the $(2q-1) f_{offset}$ factor. For the present illustration for the relative phase measurement between the first and second harmonically related spectral components of interest, therefore, $f_{fund\_samp}$ is 500 MHz and the frequency offset for the sampler fundamental is 1 kHz. With specific reference to FIG. 9 of the drawings, for a relative phase measurement between $f_{meas\_1}$ 400 at 1 GHz and $f_{meas\_2}$ 401 at 2 GHz, the appropriate harmonic of the sampler fundamental frequency used to make the measurement is a first sampler frequency $f_{samp1}$ 406 at 1.5 GHz–3 kHz. With specific reference to FIG. 10 of the drawings, the first sampler frequency 406 mixes with the first and second spectral components of interest to generate first and second primary mixing products 500 at 500 MHz–3 kHz and 502 at 500 MHz+3 kHz. The VNA local oscillator 114 is tuned 414 to a frequency, $f_{lo\_1}$ 504, of 500 MHz–9 kHz. With specific reference to FIG. 11 of the drawings, the mixer 112 in the VNA 100 mixes the local oscillator signal 504 with the first and second primary mixing products 500 and 502 to yield first and second harmonically related secondary mixing products 600 and 602. In the specific example, the first and second secondary mixing products are 6 kHz and 12 kHz. Because the IF band mixing products are harmonically related to each other through proper selection of the local oscillator frequency 504 relative to the fundamental sampler frequency, and because the relative phase of the IF band secondary mixing products are stationary in the frequency domain with respect to each other, it is possible to determine 415 a relative phase between them using standard VNA digitization measurements and FFT calculations. As one of ordinary skill in the art appreciates, the offset calculated for the local oscillator is related to the offset for the harmonic of the sampler fundamental used in the relative phase measurement for the specific pair of spectral components. Specifically, the local oscillator frequency offset is selected to generate harmonically related secondary mixing products. Even more specifically, the local oscillator offset is three times the sampler harmonic frequency offset.

For a relative phase measurement between 2 GHz and 3 GHz, the harmonic of the sampler fundamental used is the second sampler frequency, $f_{samp2}$ 407, of 2.5 GHz–5 kHz. The second sampler frequency 407 mixes with the second and third spectral components of interest 401, 402 to yield first and second primary mixing products of 500 MHz–5 kHz and 500 MHz+5 kHz (not shown on FIG. 10). The VNA local oscillator is tuned to a frequency of 500 MHz–15 kHz. The local oscillator signal mixes with the primary mixing products to yield first and second secondary mixing products of 10 kHz and 20 kHz (not shown on FIG. 11). As one of ordinary skill in the art can appreciate, the mixing products for the second and third spectral components of interest are also harmonically related to each other. Through proper selection of the local oscillator frequency 504, and because the relative phase of the IF band mixing products are stationary in the frequency domain with respect to each other, it is possible to determine 415 a relative phase between them using standard VNA digitization measurements and FFT calculations.

A relative phase measurement between 9 GHz and 10 GHz, which represent the highest two frequencies measured in the specific example, uses a 19$^{th}$ harmonic of the sampler fundamental (2NK–1) which is 9.5 GHz–19 kHz and the VNA local oscillator 114 is tuned to a frequency of 500 MHz–57 kHz. Following the examples and equations provided, the first and second primary mixing products are 500 MHz–19 kHz and 500 MHz+19 kHz. When the primary mixing products mix with the properly tuned local oscillator signal, it yields first and second secondary mixing products of 38 kHz and 76 kHz. Once again, because the IF band mixing products are harmonically related to each other through proper selection of the local oscillator frequency 504, and because the relative phase of the IF band mixing products are stationary in the frequency domain, it is possible to determine 415 a relative phase between them using standard VNA digitization measurements and FFT calculations. As one of ordinary skill in the art further appreciates, 76 kHz is the highest frequency signal being measured in the VNA IF and is well within the VNA IF bandwidth.

Relative phase measurements are made between all adjacent pairs of spectral components of interest by tuning the VNA local oscillator frequency and then measuring relative phase between the secondary mixing products of the adjacent frequencies using the VNA 100. In some cases, one or more of the spectral components of interest is a local null and there is insufficient amplitude for a relative phase measurement to be made with reference to it. In that case, a relative phase measurement is made between the two spectral components of interest on either side of the local null in the frequency spectrum. As can be gleaned from the present teachings, if there are no local nulls, all measurements of adjacent harmonics of the stimulus fundamental mix with an odd harmonic of the sampler fundamental. The even harmonics of the sampler fundamental, however, are present in the spectrum and are not used if all harmonics of the stimulus fundamental can be measured. If it is necessary to make the relative phase measurement by omitting measurement with reference to a local null, the same process is followed as disclosed herein except that the even harmonic of the sampler fundamental that is located approximately half-way between the adjacent spectral components of interest is used. The frequency offset is calculated with respect to the harmonic of the sampler fundamental of interest for the particular measurement, and the relative phase measurement is made. In the specific example, assume that the second harmonic is a local null. In that case, a relative phase measurement is made between the first and third harmonics of the stimulus fundamental. Specifically, measurement is made between 1 GHz and 3 GHz. The sampler frequency of interest, therefore, is the harmonic of the sampler fundamental equal to 2 GHz less the appropriate offset. The appropriate offset is calculated based upon the harmonic of the sampler fundamental as 2 GHz–4 kHz. The VNA local oscillator frequency must also be appropriately tuned to accommodate the larger frequency difference between the spectral components being measured. With reference to equation (12) the VNA local oscillator 114 is tuned to a frequency of 1 GHz less three times the sampler harmonic offset of 4 kHz. Accordingly, the VNA local oscillator 114 is tuned to a frequency of 1 GHz–12 kHz to generate first and second secondary mixing products of 8 kHz and 16 kHz. The first and second secondary mixing products are harmonically related and are stationary in the frequency domain relative to each other and are measured with the VNA as disclosed.

Figure 12:
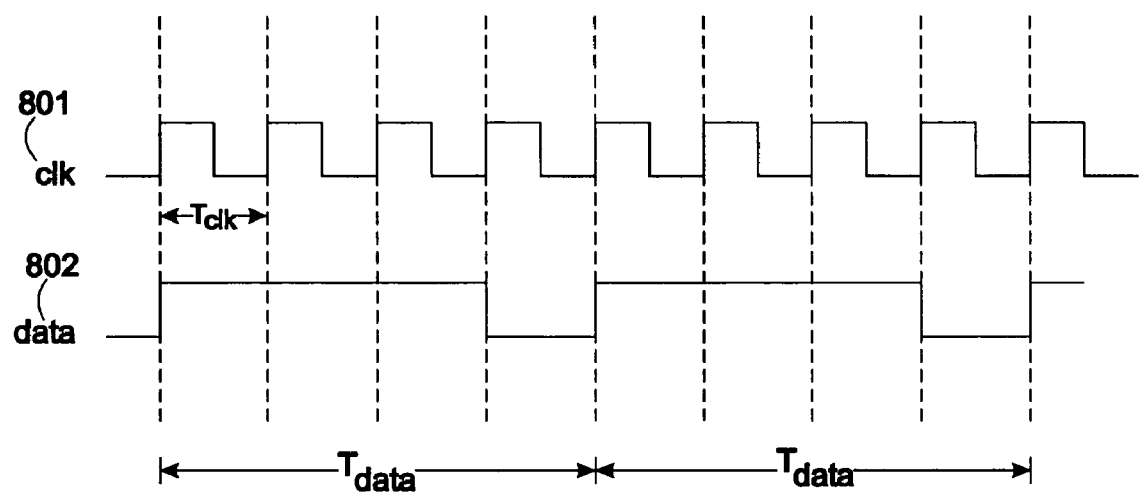
FIG. 12 is a time domain representation of a digital clock and a repetitive 4-bit digital data signal.

The DUT is then stimulated 306 with other digital signals and the output response is measured using a process identical to the steps 302, 303 and 305 with spectral components of interest that are measured using the new stimulus signal. Because each iteration takes time and computational power, it is preferable that as few as possible stimulus and output responses of the DUT are measured in order to arrive at a reliable model. In an example, the clock frequency, $f_{clock}$, and DUT measurement bandwidth remains the same and the DUT is stimulated with different duty cycle square waves. As an example, a constant 50% duty cycle 500 MHz square wave approximates a 4-bit repetitive digital signal comprising pairs of alternating "1"s and "0"s at the 2 GHz clock frequency. The same measurement process steps 302, 303, and 305 as followed in the example of the 1 GHz square wave, therefore applies for measurements at the lower stimulus frequency square wave. The measurement process is repeated 310 some number of times by changing frequency and duty cycle for various square waves. It is also desirable to alter the duty cycle of the square wave stimulus to approximate a digital stimulus signal with a different number of "1"s relative to the number of "0"s for a 2 GHz digital clock signal. With specific reference to FIG. 12 of the drawings, there is shown a clock signal 801 relative to a digital data stimulus signal 802. Assuming the clock signal is 2 GHz, the digital data stimulus signal 802 illustrated in FIG. 12 has a period of four times the clock period. That is to say, that the data signal 802 has a frequency of one fourth of the clock frequency and N=4. As previously mentioned, K remains as 5. In the example, therefore, the data 802 comprises a constant 75% duty cycle 500 MHz square wave and measurements are made on 20 harmonics of the fundamental of $f_{clock}/4$. Other square wave stimuli are represented in a similar manner. Regardless of the duty cycle the spectral components of interest are stationary in the frequency domain because the digital signal is repetitive. The number and nature of stimulus signals chosen for measurement depend upon the model and the expected operating environment and suspected failure modes for the DUT.

The magnitude and phase VNA measurement data from the square wave stimuli and all relative spectral phase measurement data is transferred to a non-linear modeling system such as Agilent's ADS (Advanced Design System) product. The VNA measurements made in the presence of the various digital stimuli provide a first pass at creation 311 of a high frequency model for the DUT 140.

A next step in the process of developing a reliable model of the DUT is determining a complex digital repetitive bit sequence for exercising the first pass model of the DUT. The model simulates 313 a bit sequence stimulus and expected DUT response to the digital bit sequence at the digital clock frequency based upon the current state of the model. The DUT 140 is then actually stimulated 314 with the same digital bit sequence as used in the simulation of step 312. For purposes of performing the measurement, the bit sequence is a pseudorandom and repetitive signal. The DUT response to the bit sequence is measured using the same process described in steps 302, 303 and 305. The repetitive bit sequence is complex and has many different spectral components, but because it is repetitive, it is stationary in the frequency domain. Therefore, the spectral components that are stationary in the frequency domain may be measured using the processes described with digitizing and FFT technology.

Figure 13:
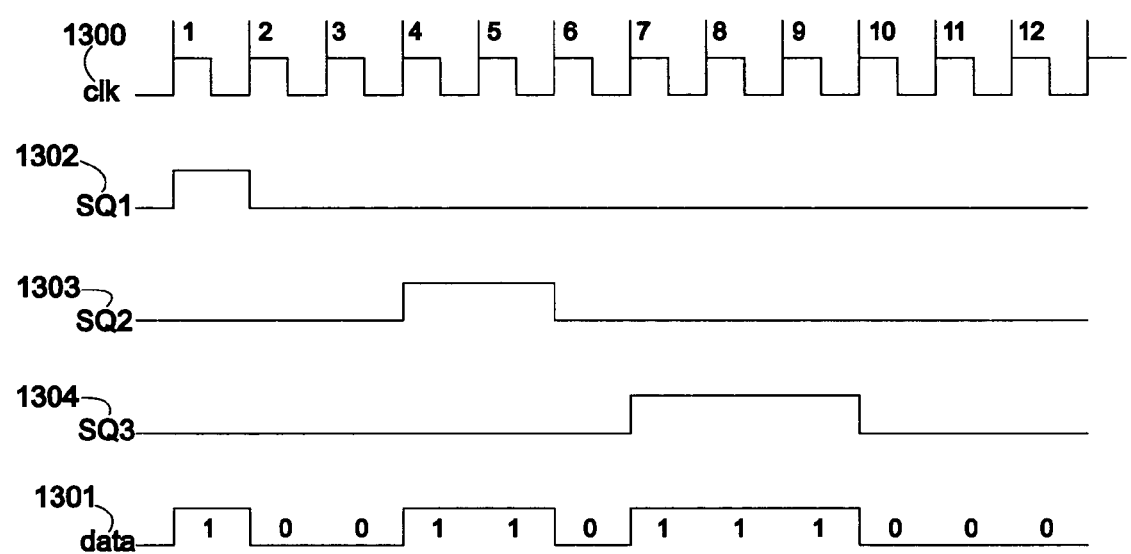
FIG. 13 is a time domain representation of a digital clock, a 12-bit digital data signal, and three square waves delayed in time that combine to mathematically represent the digital data signal.
Figure 14:
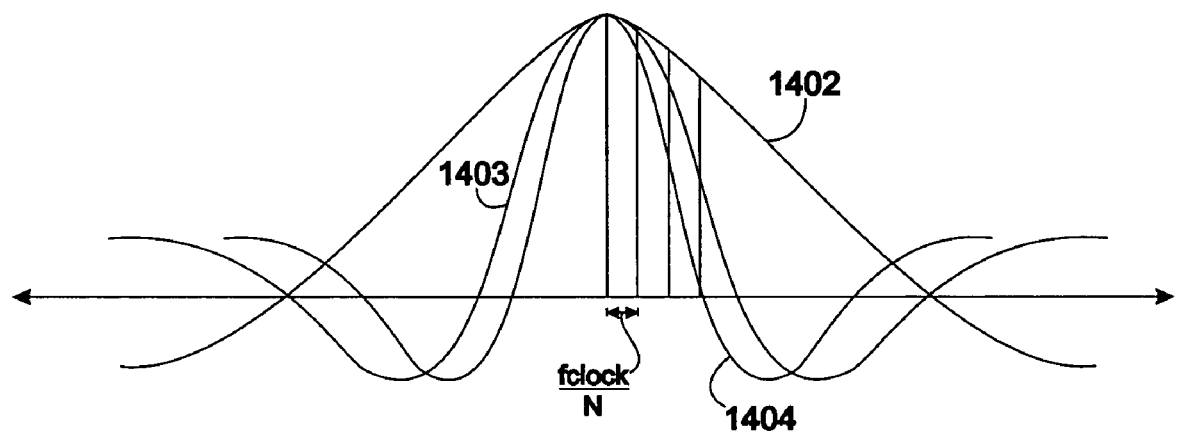
FIG. 14 is a frequency domain representation of the square waves shown in FIG. 13 that combine to represent the digital data signal.

A long and complex bit sequence may be mathematically represented as a composite of multiple single cycle repetitive square waves of some frequency and constant duty cycle offset in time. With specific reference to FIG. 13 of the drawings, there is shown a clock signal 1300 and data signal 1301. The simplified data signal shown is a 12-bit digital bit sequence comprising, "100110111000". Accordingly, N=12. A much longer and more complex digital bit sequence can be represented using the same process with a larger number of single cycle repetitive square waves, but a 12-bit sequence is shown for illustrative purposes. Also shown in FIG. 13 are first, second and third square wave signals 1302, 1303 and 1304 that combine to represent the bit sequence shown as data 1301. Each square wave 1302, 1303, 1304 can be represented as a repetitive square wave signal of some duty cycle having a period 12 times that of the clock, where $T_{data}=12T_{clock}$. With reference back to the teachings in FIGS. 4, 5, and 6, spectral components of interest may be determined by appropriate selection of the square and comb functions in the time domain, convolution to the frequency domain or multiplication in the time domain as previously disclosed for each square wave signal 1302, 1303, and 1304. With specific reference to FIG. 14 of the drawings, there is shown spectral envelopes 1402, 1403, and 1404 of each of the square waves 1302, 1303, and 1304, respectively, that combine to comprise the data signal 1301. As can be seen from the analysis of FIGS. 4, 5, and 6, the constituent spectral components of each square wave 1302, 1303, and 1304 are the same and the different envelopes cause the components to add or subtract in magnitude and phase to comprise the spectral content of the digital bit sequence. The fundamental of the spectral components for the bit sequence is:

$$f_{\text{fund\_stim}} = \frac{f_{clock}}{N} \quad (15)$$

where N is equal to the number of clock cycles in the bit sequence. In the example of FIGS. 13 and 14, N=12 and the clock frequency remains 2 GHz. The fundamental frequency of the stimulus, therefore, is 166.667 MHz. Spectral components of interest are those spectral components that are harmonically related to the stimulus fundamental and are less than the overall measurement bandwidth. With reference to equation (6), the frequency of the sampler offset is calculated based upon the largest offset necessary to make the measurement where:

$$(2NK - 1)\frac{f_{\text{offset}}}{3} \leq \frac{BW_{IF}}{4} \quad (16)$$

In the example of FIG. 13, therefore, the offset is calculated to be:

$$f_{\text{offset}} \leq \frac{1000 \text{ kHz}}{4} \cdot \frac{3}{(2 \cdot 12 \cdot 5 - 1)} = \frac{75 \text{ kHz}}{119} \quad (17)$$

With reference to equation (5), the sampler fundamental frequency is established as:

$$f_{\text{samp\_fund}} = \frac{f_{clock}}{2NM} - \frac{f_{\text{offset}}}{3M} \quad (18)$$

Where M is the smallest integer value to place the term $f_{clock}/2NM$ with the sampler fundamental frequency range. In the example of FIG. 13, therefore:

$$f_{\text{samp\_fund}} = \frac{2 \text{ GHz}}{2 \cdot 12M} - \frac{f_{\text{offset}}}{3M} \quad (19)$$
$$= \frac{1 \text{ GHz}}{12M} - \frac{f_{\text{offset}}}{3M}$$

For the present example, M=1, and $f_{\text{samp\_fund}}$ is established.

The process of stimulus and measurement is then performed as previously described for the bit sequence. As shown in equation (13), there are NK or 60 spectral frequencies of interest and NK−1=(5)(12)−1=59 relative phase measurements are made between 59 pairs of spectral components.

The results of stimulus and measurement process are fed into the digital device model to refine the model for improved prediction of DUT response to complex bit sequences. To measure a relative phase between pairs of spectral components of interest, it is known that the sampler 130 has a harmonic of the sampler fundamental frequency that is approximately halfway between the two spectral components being measured in combination with the offset as previously described. The primary mixing products (500 and 502 as an example) of the selected sampler harmonic (406 as an example) and the spectral components being measured (400 and 402 as an example) are then mixed with the tuned VNA local oscillator to place the resulting secondary mixing products (600 and 602 as an example) within the VNA IF bandwidth for measurement.

In making the relative phase measurements according to the present teachings, it is assumed that the group delay through the sampler 130 is constant over the frequency range of interest and that the 3 dB frequency point of the sampler 130 is at least two orders of magnitude greater than the highest spectral component of interest in the digital signal stimulus.

The simulated and measured responses to the same digital bit sequence are then compared 317. If the measurement falls within some tolerance range of the simulated model, the model of the DUT has converged 320 with measured values and the model is deemed complete. If the measurement falls outside some tolerance range of the simulated response 321, more data is necessary to inform the model for appropriate convergence with the actual behavior of the DUT 140. Accordingly, the measured response to the composite digital bit sequence is entered into the model and the process of determining a new digital bit pattern 312, approximating the complex digital bit sequence, simulating the DUT response 313, stimulating the DUT with the new digital bit pattern 314, and measuring the actual response 302, 303, 305, comparing 317 the two to determine convergence 318 repeats until the simulated and measured results converge within the limits set.

Embodiments are herein described by way of illustrative example. The examples described, therefore, are illustrative and not limitive of the present invention. As an example, a choice of clock frequency, square wave stimulus and digital bit pattern for most efficient generation of a reliable model is dependent upon the digital device to be measured and modeled. The teachings herein, however, may be applied to stimulus and measurement for any number of digital stimulus. Also possible with amplitude and the relative phase measurements of all spectral components is reproduction of the digital response signal from the digital stimulus using conventional inverse FFT technology. In this way, the relative magnitude and phase between all spectral components may be used to present time domain data in the same format as an oscilloscope. Advantageously, a much higher measurement bandwidth, dynamic range, and accuracy is possible at high frequencies when compared with conventional high frequency oscilloscopes. The time domain information may also be used to generate eye diagrams at higher frequencies than conventionally available. In another embodiment, a digital device uses a return to zero convention. Accordingly, a highest frequency digital stimulus is an all "1"s bit pattern at the clock frequency. Using the teachings herein, one of ordinary skill in the art is able to adapt to stimulus using the RZ convention. Other embodiments will occur to one of ordinary skill in the art given the benefit of the present teachings and are considered to be within the scope of the appended claims.

The invention claimed is:

1. A method of measuring a digital device comprising the steps of:
   providing a vector network analyzer ("VNA") having a sampler having as inputs a digital stimulus signal having at least two harmonically related spectral components and a repetitive impulse signal and an output signal comprising said digital stimulus signal conditioned by said repetitive impulse signal,
   connecting said device to said VNA, said device operating at a clock frequency,
   stimulating said device with said digital stimulus signal having at least two harmonically related spectral components,
   measuring s-parameters of said device at each spectral component,
   stimulating said device with said output signal, and
   measuring a relative phase between at least one pair of said spectral components.

2. A method as recited in claim 1 and further comprising the step of measuring absolute power of said at least two spectral components.

3. A method as recited in claim 2 and further comprising the steps of calibrating ratio measurements of said VNA and calibrating absolute power measurements of said VNA.

4. A method as recited in claim 1 wherein said digital signal comprises a constant duty cycle square wave.

5. A method as recited in claim 4 wherein said digital signal comprises a constant 50% duty cycle square wave at half of said clock frequency.

6. A method as recited in claim 5 wherein said step of measuring further comprises measuring all harmonically related spectral components up to an overall measurement bandwidth as defined by ratio s-parameter measurements made with said 50% duty cycle square wave stimulus.

7. A method as recited in claim 6 wherein said overall measurement bandwidth is defined by a highest frequency spectral component that is within a predefined range of said highest amplitude spectral component.

8. A method as recited in claim 1 and further comprising the step of developing a model of said device based upon measurements made of said s-parameters and said relative phase.

9. A method as recited in claim 8 and further comprising the steps of simulating a response of said model to a digital bit pattern stimulus, stimulating said device with said digital bit pattern stimulus, measuring a response to said digital bit pattern stimulus, comparing said measured response against said simulated response, and refining said model to reflect said measured response.

10. A method as recited in claim 9 and further comprising repeating the steps of simulating, stimulating, measuring and comparing until said simulated response and said measured response converges.

11. A method of measuring a digital device comprising
   Providing a vector network analyzer ("VNA"),
   Connecting said device to said VNA, said device operating at a clock frequency,
   Stimulating said device with a digital stimulus signal having at least two harmonically related spectral components,
   Measuring sparameters of said device at each spectral component,
   Stimulating said device with said digital stimulus signal wherein said digital stimulus signal comprises a repetitive digital bit sequence having a frequency of $1/N^{th}$ of the clock frequency where N is a number of bits in said bit sequence, and
   Measuring relative phase between at least one pair of spectral components.

12. A method as recited in claim 11 wherein said step of measuring relative phase further comprises the steps of determining a sampler fundamental frequency as a function of said clock frequency and an intermediate frequency ("IF") bandwidth of said VNA wherein a harmonic of said sampler fundamental frequency is a multiple of 1/2N of the clock frequency less a sampler frequency offset.

13. A method as recited in claim 12 wherein said sampler frequency offset is a function of said IF bandwidth, N, and an overall measurement bandwidth.

14. A method as recited in claim 13 wherein said sampler frequency fundamental is:

$$\frac{f_{clock}}{2NM} - \frac{f_{offset}}{3M}$$

where $f_{clock}$ is a frequency of said clock, $f_{offset}/3$ is said sampler fundamental frequency offset and M is a minimum integer value that places said sampler fundamental frequency within a sampler fundamental bandwidth.

15. A method as recited in claim 14 wherein said sampler fundamental frequency offset ($f_{offset}/3$) is:

$$\frac{BW_{IF}}{4(2NK-1)}$$

where $BW_{IF}$ is the IF bandwidth and K is a factor defined by said overall measurement bandwidth divided by said clock frequency.

16. A method of measuring a digital device comprising
   Providing a vector network analyzer ("VNA"),
   Connecting said device to said VNA, said device operating at a clock frequency,
   Stimulating said device with a digital stimulus signal having at least two harmonically related spectral components,
   Measuring s-parameters of said device at each spectral component,
   Stimulating said device with said digital stimulus signal conditioned by a repetitive impulse signal, and
   Measuring a relative phase between at least one pair of said spectral components by determining a sampler fundamental frequency as a function of said clock frequency and a sampler fundamental frequency offset as a function of an intermediate frequency ("IF") bandwidth of said VNA.

17. A method as recited in claim 16 wherein said step of calculating said sampler fundamental frequency further comprises establishing said sampler fundamental frequency wherein a harmonic of said sampler fundamental frequency is disposed in the frequency domain approximately halfway between each said pair of spectral components.

18. A method as recited in claim 17 wherein said step of determining said sampler fundamental frequency further comprises establishing a value for said sampler fundamental frequency as large as possible within a drive frequency range of said sampler.

19. A method as recited in claim 16 wherein for each pair of said spectral components, said step of establishing said sampler fundamental frequency generates first and second primary mixing products of respective harmonics of said sampler fundamental frequency corresponding to each said pair of spectral components and wherein said step of measuring relative phase for each said pair of spectral components further comprises tuning a local oscillator to a frequency equal to half a frequency difference between said spectral components less a local oscillator frequency offset to generate harmonically related secondary mixing products resulting from mixing between said primary mixing products and said local oscillator frequency and measuring relative phase between said secondary mixing products.

20. A method as recited in claim 19 wherein said local oscillator frequency offset is equal to three times a respective harmonic frequency offset.

21. A method as recited in claim 19 and repeating said step of tuning said local oscillator before measuring relative phase for each pair of said spectral components.

22. An apparatus for measuring relative phase in a non-linear device comprising:
  a vector network analyzer ("VNA") having a local oscillator,
  a digital data generator having a digital data output driving a sampler, said sampler also receiving a repetitive impulse signal, an output of said sampler comprising a digital stimulus signal for said device, said digital stimulus signal having at least two spectral components, and
  a processor, said processor determining a sampler fundamental frequency and a sampler fundamental frequency offset based upon said spectral components, and for determining at least one local oscillator frequency for measuring relative phase between at least one pair of said spectral components.

23. An apparatus as recited in claim 22 wherein said digital stimulus signal comprises a constant duty cycle square wave signal.

24. An apparatus as recited in claim 23 wherein said digital data output comprises a constant 50% duty cycle square wave signal.

25. An apparatus as recited in claim 22 wherein said device operates at a clock frequency and said digital data output comprises a repetitive bit sequence of said clock frequency over N, where N is equal to a number of bits in said bit sequence.

26. An apparatus as recited in claim 25 wherein said sampler fundamental frequency and said sampler fundamental frequency offset are determined as a function of said spectral components, an intermediate bandwidth of said VNA, and said clock frequency.

27. An apparatus as recited in claim 26 wherein said sampler fundamental frequency is determined so that a harmonic of said sampler fundamental frequency is disposed in a frequency domain approximately halfway between said spectral components.

28. An apparatus as recited in claim 27 wherein said harmonic of said sampler fundamental frequency is a multiple of 1/2N of said clock frequency less a sampler harmonic frequency offset.

29. An apparatus as recited in claim 28 wherein said VNA has an intermediate frequency ("IF") bandwidth and said sampler fundamental frequency offset is a function of said VNA IF bandwidth, N, and a DUT measurement bandwidth.

30. An apparatus as recited in claim 27 wherein said sampler frequency fundamental is:

$$\frac{f_{clock}}{2NM} - \frac{f_{offset}}{3M}$$

where $f_{clock}$ is said clock frequency, $f_{offset}/3$ is said sampler fundamental frequency offset and M is a minimum integer value that places said sampler fundamental frequency within a sampler fundamental bandwidth.

31. An apparatus as recited in claim 30 wherein said sampler fundamental frequency offset ($f_{offset}/3$) is:

$$\frac{BW_{IF}}{4(2NK-1)}$$

where $BW_{IF}$ is said VNA IF bandwidth and K is a factor defined by a DUT measurement bandwidth divided by said clock frequency.

32. An apparatus as recited in claim 22 and further comprising a series circuit comprising a voltage controlled oscillator ("VCO") and step recovery diode module for driving said sampler.

33. An apparatus as recited in claim 22 and further comprising a re-timer disposed between said digital data output and an input of said sampler.

34. An apparatus as recited in claim 22 wherein said processor determines said sampler fundamental frequency that is as large as possible within a drive frequency range of said sampler.

35. An apparatus as recited in claim 22 wherein said at least two spectral components comprise at least one pair of spectral components and for said at least one pair of said spectral components, a respective harmonic of said sampler fundamental frequency mixes with said at least one pair of spectral components to generate first and second primary mixing products and wherein said local oscillator is tuned to a frequency equal to half a frequency difference between said pair of spectral components less a local oscillator frequency offset to generate harmonically related secondary mixing products resulting from mixing between said primary mixing products and said local oscillator frequency.

36. An apparatus as recited in claim 35 wherein said local oscillator is tuned to a different frequency before measuring relative phase for each pair of said spectral components.

37. An apparatus as recited in claim 22 wherein said processor develops a model of said device based upon measurements made of said s-parameters and said relative phase.

38. An apparatus as recited in claim 37 wherein said processor simulates a response of said model to a digital bit pattern stimulus, and causes said digital data generator to stimulate said device with said digital bit pattern stimulus, said VNA measures a response to said digital bit pattern stimulus, said processor compares said measured response against said simulated response, and said processor refines said model to reflect said measured response.

39. An apparatus as recited in claim 38 and further comprising means for repeating simulating, stimulating, measuring and comparing until said simulated response and said measured response converge.

40. An apparatus for characterizing a non-linear device comprising:
  a sampler having as inputs, a repetitive digital signal having at least two harmonically related spectral components and a repetitive impulse signal, an output of said sampler providing a stimulus signal, means for stimulating said device with said stimulus signal, a vector network analyzer ("VNA") for measuring s-parameters of said device at each said spectral component, and means for measuring a relative phase with said VNA between at least one pair of said spectral components.

41. An apparatus as recited in claim 40 and further comprising means for recreating a response to said stimulus signal in a time domain based upon said s-parameters and said relative phase measurement.

42. An apparatus as recited in claim 40 and further comprising means for generating a model of said device based upon said s-parameter and said relative phase measurements.

43. An apparatus for characterizing a non-linear device comprising means for simulating a response of a model of said device to a digital bit pattern stimulus, means for stimulating said device with a stimulus signal having at least two harmonically related spectral components comprising said digital bit pattern stimulus, a vector network analyzer ("VNA") for measuring s-parameters of said device at each said spectral component, means for measuring a relative phase with said VNA between at least one pair of said spectral components, means for measuring a response to said digital bit pattern stimulus, means for comparing said measured response against said simulated response, and means for refining said model to reflect said measured response.

44. An apparatus as recited in claim 43 wherein said means for measuring a relative phase between said at least one pair of said spectral components further comprises means for determining a sampler fundamental frequency as a function of a frequency of said spectral components and an intermediate frequency ("IF") bandwidth of said VNA.

45. An apparatus as recited in claim 44 wherein said device operates at a clock frequency and said sampler fundamental frequency is a function of said clock frequency and a sampler fundamental frequency offset, wherein said sampler fundamental frequency is a function of an intermediate frequency ("IF") bandwidth of said VNA.

46. An apparatus as recited in claim 45 wherein a harmonic of said sampler fundamental frequency is disposed in the frequency domain approximately halfway between each said pair of spectral components.

47. An apparatus as recited in claim 44 wherein said sampler fundamental frequency is as large as possible within a drive frequency range of said sampler.

48. An apparatus as recited in claim 44 wherein a harmonic of said sampler fundamental frequency mixes with said pair of said spectral components to generate first and second primary mixing products and said first and second primary mixing products mix with a local oscillator frequency in said VNA to generate harmonically related secondary mixing products, said secondary mixing products reflecting a relative phase between said pair of said spectral components.

49. An apparatus as recited in claim 48 wherein there are a plurality of said pairs of said spectral components and for said relative phase measurement, each said pair of spectral components corresponds to a respective one of a plurality of said harmonics of said fundamental sampler frequency and each said pair of said spectral components corresponds to a respective local oscillator frequency for generating a plurality of said secondary mixing products.

50. A method for measuring a non-linear device response to a digital stimulus comprising the steps of:

providing a vector network analyzer ("VNA"), stimulating said device with a repetitive digital signal, said repetitive digital signal comprising at least two harmonically related spectral components, measuring s-parameters at each spectral component of interest, measuring relative phase between pairs of said spectral components, wherein said step of measuring relative phase further comprises the steps of conditioning said repetitive digital signal with a repetitive impulse signal at a sampler fundamental frequency, a respective harmonic of said sampler fundamental frequency disposed between each said pair of said spectral components in the frequency domain to generate primary mixing products of said respective harmonic of said sampler fundamental frequency and said pair of said spectral components, tuning a local oscillator in said VNA to mix with said primary mixing products to generate harmonically related secondary mixing products of said primary mixing products and said local oscillator and measuring relative phase between said secondary mixing products to reflect a relative phase between said pair of spectral components.

51. A method as recited in claim 50 and further comprising the step of recreating a time domain device response to said digital stimulus from said s-parameter and relative phase measurements.

52. A method as recited in claim 50 wherein said step of conditioning comprises driving a sampler with said repetitive digital stimulus signal and said repetitive impulse signal.

53. A method as recited in claim 50 wherein each one of said respective harmonics of said sampler fundamental frequency is approximately halfway between each said pair of said spectral components in the frequency domain.

54. A method as recited in claim 53 wherein said device operates at a clock frequency and said sampler fundamental frequency is a function of said clock frequency and a sampler fundamental offset frequency, and said sampler fundamental offset frequency is a function of an intermediate frequency ("IF") bandwidth of said VNA.

55. A method as recited in claim 54 wherein said sampler fundamental frequency is as large as possible within a drive frequency range of said sampler.

56. A method as recited in claim 50 wherein there are a plurality of said pairs of said spectral components and further comprising the step of repeating said step of tuning said local oscillator before measuring relative phase for each pair of said spectral components.

57. A method as recited in claim 50 wherein devices operates at a clock frequency and said digital signal comprises a repetitive digital bit sequence having a frequency of $1/N^{th}$ of the clock frequency where N is a number of bits in said bit sequence.

58. A method as recited in claim 57 wherein said step of measuring relative phase further comprises the steps of determining a sampler fundamental frequency as a function of said clock frequency and an intermediate frequency ("IF") bandwidth of said VNA wherein a harmonic of said sampler fundamental frequency is a multiple of 1/2N of the clock frequency less a sampler frequency offset.

59. A method as recited in claim 58 wherein said sampler frequency offset is a function of said IF bandwidth, N, and an overall measurement bandwidth.

60. A method as recited in claim 58 wherein said sampler fundamental frequency is:

$$\frac{f_{clock}}{2NM} - \frac{f_{offset}}{3M}$$

where $f_{clock}$ is a frequency of said clock, $f_{offset}/3$ is a sampler fundamental frequency offset and M is a minimum integer value that places said sampler fundamental frequency within a sampler fundamental bandwidth.

61. A method as recited in claim 60 wherein said sampler fundamental frequency offset ($f_{offset}/3$) is:

$$\frac{BW_{IF}}{4(2NK-1)}$$

where $BW_{IF}$ is the IF bandwidth and K is a factor defined by said overall measurement bandwidth divided by said clock frequency.

* * * * *